United States Patent
van Oevelen

(10) Patent No.: US 11,112,455 B2
(45) Date of Patent: Sep. 7, 2021

(54) BUILT-IN SELF-TEST CIRCUITS AND RELATED METHODS

(71) Applicant: Texas Instruments Incorporated, Dallas, TX (US)

(72) Inventor: Jacco van Oevelen, Niederaichbach (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 186 days.

(21) Appl. No.: 16/286,413

(22) Filed: Feb. 26, 2019

(65) Prior Publication Data

US 2020/0271722 A1    Aug. 27, 2020

(51) Int. Cl.

| | | |
|---|---|---|
| G01R 31/317 | (2006.01) | |
| H02M 3/158 | (2006.01) | |
| H02M 1/32 | (2007.01) | |
| G01R 31/3193 | (2006.01) | |
| G01R 31/319 | (2006.01) | |
| G01R 31/3187 | (2006.01) | |
| G01R 31/34 | (2020.01) | |

(52) U.S. Cl.
CPC ... *G01R 31/31724* (2013.01); *G01R 31/3187* (2013.01); *G01R 31/31721* (2013.01); *G01R 31/31924* (2013.01); *G01R 31/31932* (2013.01); *G01R 31/31937* (2013.01); *H02M 1/32* (2013.01); *H02M 3/1582* (2013.01)

(58) Field of Classification Search
None
See application file for complete search history.

(56) References Cited

U.S. PATENT DOCUMENTS

| | | | | |
|---|---|---|---|---|
| 5,229,966 A | * | 7/1993 | Ohsawa | G11C 11/4074 365/189.09 |
| 5,258,947 A | * | 11/1993 | Sourgen | G11C 16/30 257/E23.147 |
| 5,640,509 A | | 6/1997 | Balmer et al. | |
| 5,710,716 A | * | 1/1998 | Hurst | G01G 19/12 177/136 |
| 5,987,632 A | * | 11/1999 | Irrinki | G11C 29/44 714/711 |
| 6,091,648 A | | 7/2000 | Furutani et al. | |
| 6,100,741 A | * | 8/2000 | Ogawa | G06G 7/163 327/356 |

(Continued)

OTHER PUBLICATIONS

Jun et al., A BIST scheme based on resistance match for current-mode R-2R ladder Digital-to-Analog Converter, IEEE, vol. 3, Conference Paper, pp. 305-309 (Year: 2011).*

(Continued)

*Primary Examiner* — April Y Blair
*Assistant Examiner* — Dipakkumar B Gandhi
(74) *Attorney, Agent, or Firm* — Ray A. King; Charles A. Brill; Frank D. Cimino

(57) ABSTRACT

Built-in self-test (BIST) circuits and related methods are disclosed. An example BIST circuit includes a state machine to generate a control signal to reduce a gate voltage associated with a transistor from a first voltage to a second voltage when an enable signal is asserted, the transistor to be enabled at the first voltage and the second voltage, and assert an alert signal when a gate-to-source voltage associated with the transistor satisfies a threshold when the gate voltage is reduced to the second voltage.

20 Claims, 13 Drawing Sheets

(56) References Cited

U.S. PATENT DOCUMENTS

| | | | |
|---|---|---|---|
| 6,255,836 B1 | 7/2001 | Schwarz et al. | |
| 6,624,405 B1 | 9/2003 | Lau et al. | |
| 6,665,214 B1* | 12/2003 | Cheah | G11C 29/02 |
| | | | 365/185.19 |
| 6,707,718 B1* | 3/2004 | Halim | G11C 29/16 |
| | | | 365/185.18 |
| 2005/0040841 A1* | 2/2005 | Iadanza | G01R 31/31721 |
| | | | 324/764.01 |
| 2006/0221525 A1* | 10/2006 | Konishi | H02J 7/1461 |
| | | | 361/93.1 |
| 2007/0007912 A1* | 1/2007 | Yang | H03K 17/6872 |
| | | | 315/291 |
| 2008/0116965 A1* | 5/2008 | Ogiwara | G05F 3/30 |
| | | | 327/543 |
| 2008/0174358 A1* | 7/2008 | Tang | H03K 17/163 |
| | | | 327/434 |
| 2009/0167094 A1* | 7/2009 | Tseng | G01R 31/31721 |
| | | | 307/80 |
| 2009/0261654 A1* | 10/2009 | Chiu | H02J 7/0068 |
| | | | 307/66 |
| 2010/0171732 A1* | 7/2010 | Miyazaki | G05F 3/30 |
| | | | 345/211 |
| 2011/0187439 A1* | 8/2011 | Sugie | H03K 17/687 |
| | | | 327/424 |
| 2013/0027053 A1* | 1/2013 | Lee | G01R 31/2884 |
| | | | 324/538 |
| 2013/0085651 A1* | 4/2013 | Johannsson | B60W 30/143 |
| | | | 701/93 |
| 2013/0134889 A1* | 5/2013 | Chen | H05B 45/37 |
| | | | 315/193 |
| 2013/0307576 A1* | 11/2013 | Ilkov | G01R 31/2822 |
| | | | 324/762.02 |
| 2013/0328846 A1* | 12/2013 | Jamal | G09G 3/3225 |
| | | | 345/211 |
| 2014/0015501 A1* | 1/2014 | Youn | H02M 3/158 |
| | | | 323/272 |
| 2018/0358817 A1* | 12/2018 | Koyama | H01M 10/482 |
| 2019/0267082 A1* | 8/2019 | Parkinson | G11C 13/0009 |

OTHER PUBLICATIONS

Jun et al., A BIST scheme for operational amplifier by checking the stable output of transient response, IEEE, Conference Paper, pp. 885-888. (Year: 2011).*

PCT Search Report dated May 28, 2020.

* cited by examiner

US 11,112,455 B2

BUILT-IN SELF-TEST CIRCUITS AND RELATED METHODS

FIELD OF THE DISCLOSURE

This disclosure relates generally to power converters and, more particularly, to built-in self-test circuits and related methods.

BACKGROUND

Power converter circuits are used in various devices to convert input voltages to desired output voltages. For example, a buck converter converts an input voltage into a lower, desired output voltage by controlling transistors and/or switches to charge and/or discharge inductors and/or capacitors to maintain the desired output voltage. Power converters may include one or more power switches that may be used to change current paths in the power converters. When fulfilling requirements for functional safety (e.g., functional safety requirements for automotive electrical systems or electronics), a power switch, such as a metal-oxide semiconductor field-effect transistor (MOSFET), may be used to open a voltage-supply line to parts of the power converter to bring the power converter into a safe state in case of a safety-critical failure.

Figure 1:
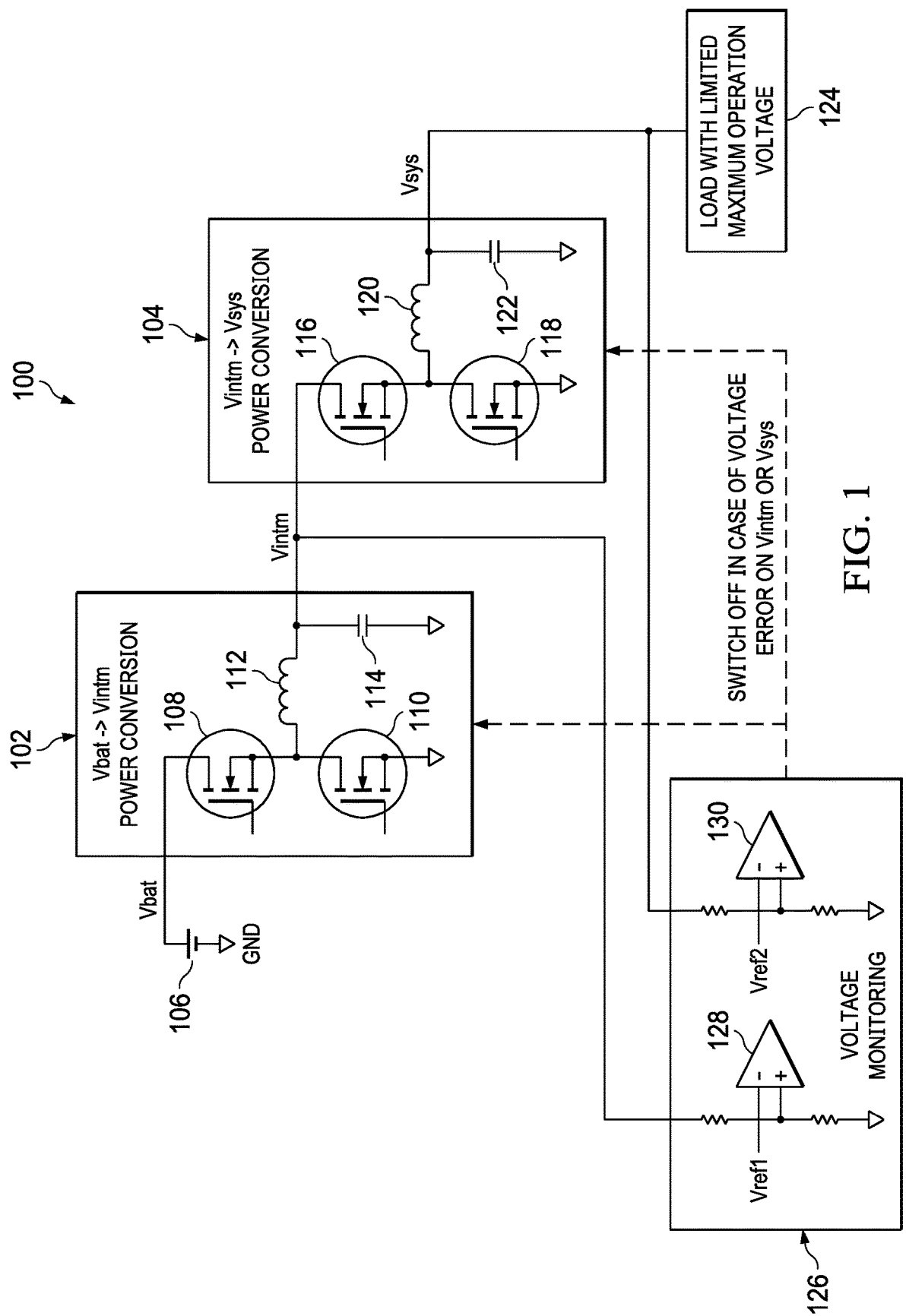
FIG. 1 is a schematic illustration of monitoring output voltages of two typical power conversion stages in series.

The figures are not to scale. In general, the same reference numbers will be used throughout the drawing(s) and accompanying written description to refer to the same or like parts. Connecting lines or connectors shown in the various figures presented are intended to represent example functional relationships and/or physical or logical couplings between the various elements. As used herein, the term "coupled" is defined as connected directly or indirectly (e.g., through one or more intervening structures and/or layers).

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Switched mode power converters (e.g., boost converters, buck converters, buck-boost converters, etc.), or power conversion stages, are used to convert a first voltage (e.g., an input voltage) to a second voltage (e.g., an output voltage). Such power converters include a switching network including one or more switching transistors coupled to a switching node that is switched to form circuit arrangements to direct current through an energy storage inductor and/or to charge/discharge an output capacitor. Such circuit arrangements supply load current and regulate the output voltage to remain substantially steady at the second voltage.

Some typical power conversion systems include aspects to fulfill requirements for functional safety. Functional safety requirements may be based on International Standards Organization (ISO) 26262, International Electrotechnical Commission (IEC) 61508, etc. ISO 26262 is an international standard for functional safety of electrical and/or electronic systems in production automobiles. IEC 61508 is an international standard corresponding to applying, designing, deploying, and maintaining automatic protection or safety-related systems.

When supplying a voltage to a power conversion system (e.g., a power conversion system in an aircraft, a land vehicle, a marine vehicle, etc.) that fulfills requirements for functional safety, a power MOSFET is typically used as a power switch to turn off to open a voltage-supply line to parts of the power conversion system. The power MOSFET opens the voltage-supply line to bring the power conversion system to a safe state in case of a safety-critical failure. For example, the power MOSFET in an electronic control unit (ECU) in a vehicle may open the voltage-supply line to the ECU when a supply input voltage has an overvoltage due to a failure in the power supply of the ECU.

In some typical power conversion systems, the power MOSFET may have a fail-short circuit failure (e.g., a fail short, a fail-short failure, a fail-short condition, etc.) that prevents the power MOSFET from opening the voltage-supply line to the relevant parts of the power conversion system to stop the flow of power. A fail-short can correspond to a short (e.g., a short circuit, a short-circuit failure, a short-circuit condition, etc.) between a source and a drain of the power MOSFET. For example, a drain-to-source resistance of a damaged or failed power MOSFET may be a resistance in a range of 0-10 ohms. In such examples, even if the power MOSFET is turned off, which should, in effect, decouple the drain and the source to prevent current flow, the low drain-to-source resistance nevertheless facilitates current to flow through the power MOSFET. Accordingly, the low drain-to-source resistance is indicative of a short existing between the source and the drain of the power MOSFET. The low drain-to-source resistance provides a current flow path even when the power MOSFET is turned off. Such a fail short is a latent defect in the power conversion system, which needs to be detected or mitigated to meet the functional safety requirements according to ISO 26262, IEC 61508, etc.

Some typical power conversion systems may use two power converters in series and monitor an output voltage of each of the power converters to mitigate a fail short. In such typical systems, if a first output associated with the first power converter or a second output associated with the second power converter is greater than a voltage threshold, the power converters are switched off. However, using two power converters in series does not detect a fail short in connection with any of the transistors of the power converters but merely determines an error in the outputs of the power converters. Accordingly, using two power converters in series increases cost, decreases power efficiency, and decreases available area in an integrated circuit that can be used for other circuitry and, thus, decreases a quantity of functions that can be offered by the integrated circuit.

Some typical power conversion systems may include a power converter that is in series with two power MOSFETs that are in series to mitigate a fail short. Such typical systems monitor an input voltage to a first one of the power MOSFETs and an output voltage from a second one of the power MOSFETs. When the input voltage or the output voltage is greater than a voltage threshold, the power converter and the power MOSFETs are switched off. However, such typical power conversion systems do not detect a fail short in the MOSFETs but mitigate an effect after a fail short has occurred in one of the two power MOSFETs. Such typical systems assume that there is no common root cause of a fail short in both power MOSFETs at the same time.

Examples disclosed herein include built-in self-test (BIST) circuits and related methods to detect a fail-short failure in a power MOSFET. In some disclosed examples, the power MOSFET is in circuit with one or more power conversion stages. The example BIST circuits detect the fail-short failure of the power MOSFET with reduced power loss and improved power efficiency compared to typical power conversion systems. In some disclosed examples, a gate-driver circuit includes a BIST circuit. When the BIST circuit is activated, the gate-driver circuit controls a voltage of a gate of the power MOSFET to regulate a drain-to-source voltage ($V_{DS}$) of the power MOSFET to a target voltage.

In some disclosed examples, the BIST circuit includes a comparator to detect whether a gate-to-source voltage ($V_{GS}$) crosses zero volts (e.g., $V_{GS}$ becomes negative, $V_{GS}$ performs a zero crossing) in response to regulating $V_{DS}$. The example BIST circuit detects a fail-short failure in the power MOSFET when the comparator detects a zero crossing of $V_{GS}$. In other examples, the BIST circuit can determine that there is not a fail-short failure associated with the power MOSFET when the comparator does not detect a zero crossing of $V_{GS}$ after expiration of a specified time interval (e.g., upon expiration of a BIST timer, after a BIST timer period has elapsed, etc.). In yet other examples, the BIST circuit can determine that there is not a fail-short failure associated with the power MOSFET when $V_{DS}$ does not satisfy a threshold (e.g., a $V_{DS}$ threshold) after expiration of the specified time interval.

In some disclosed examples, an example gate-driver circuit including the BIST circuit detects an over-voltage failure at an output of one of the one or more power conversion stages when at least one of a drain voltage ($V_D$) or a source voltage ($V_S$) satisfies a threshold when the BIST circuit is regulating $V_{DS}$. In some disclosed examples, the gate-driver circuit turns off the power MOSFET when detecting the over-voltage at the output of the power conversion stage. By turning off the power MOSFET, the example gate-driver circuit reduces damage to and/or improves (e.g., increases, extends, etc.) an operating lifetime of the power MOSFET. By turning off the power MOSFET, the example gate-driver circuit can facilitate operation of a functional safety system by providing a supply voltage that is less than a limited maximum operating voltage of the functional safety system when one or more faults has occurred in the power conversion system.

FIG. 1 is a schematic illustration of a first typical power conversion system 100 including a first typical power conversion stage 102 coupled in series to a second typical power conversion stage 104. The first power conversion stage 102 converts a first input voltage (Vbat) associated with a power source 106 to a first output voltage (Vintm). The first power conversion stage 102 includes a first N-channel MOSFET 108, a second N-channel MOSFET 110, a first inductor 112, and a first capacitor 114. In operation, the first N-channel MOSFET is turned on to facilitate current flowing from the power source 106 to the first inductor 112. The first N-channel MOSFET is turned off and the second N-channel MOSFET is turned on to facilitate current flowing from the first inductor 112 to the first capacitor 114 to charge the first capacitor 114 to Vintm.

In FIG. 1, Vintm is the voltage input to the second power conversion stage 104. The second power conversion stage 104 includes a third N-channel MOSFET 116, a fourth N-channel MOSFET 118, a second inductor 120, and a second capacitor 122. In operation, the third N-channel MOSFET 116 is turned on to facilitate current flowing from the first capacitor 114 to the second inductor 120. The third N-channel MOSFET 116 is turned off and the fourth N-channel MOSFET 118 is turned on to facilitate current flowing from the second inductor 120 to the second capacitor 122 to charge the second capacitor 122 to Vsys. Accordingly, Vsys is provided to a load 124. In FIG. 1, the load 124 has a limited maximum operation voltage to comply with functional safety requirements.

In FIG. 1, the first power conversion system 100 includes a voltage monitoring circuit 126 to monitor the output voltages of the power conversion stages 102, 104. The voltage monitoring circuit 126 includes a first comparator 128 to monitor Vintm and a second comparator 130 to monitor Vsys. The first comparator 128 compares Vintm to a first reference voltage (Vref1). The second comparator 130 compares Vsys to a second reference voltage (Vref2). If the first comparator 128 determines that Vintm is greater than Vref1 or the second comparator 130 determines that Vsys is greater than Vref2, the voltage monitoring circuit 126 turns off the power conversion stages 102, 104.

Disadvantageously, the first power conversion system 100 of FIG. 1 does not detect a fail-short associated with the N-channel MOSFETs 108, 110, 116, 118 as the voltage monitoring circuit 126 detects voltage errors associated with the output voltages Vintm and Vsys. The first power conversion system 100 of FIG. 1 is less power efficient due to heat loss associated with the second power conversion stage 104. The first power conversion system 100 of FIG. 1 has increased cost because of the addition of the second power conversion stage 104.

Figure 2:
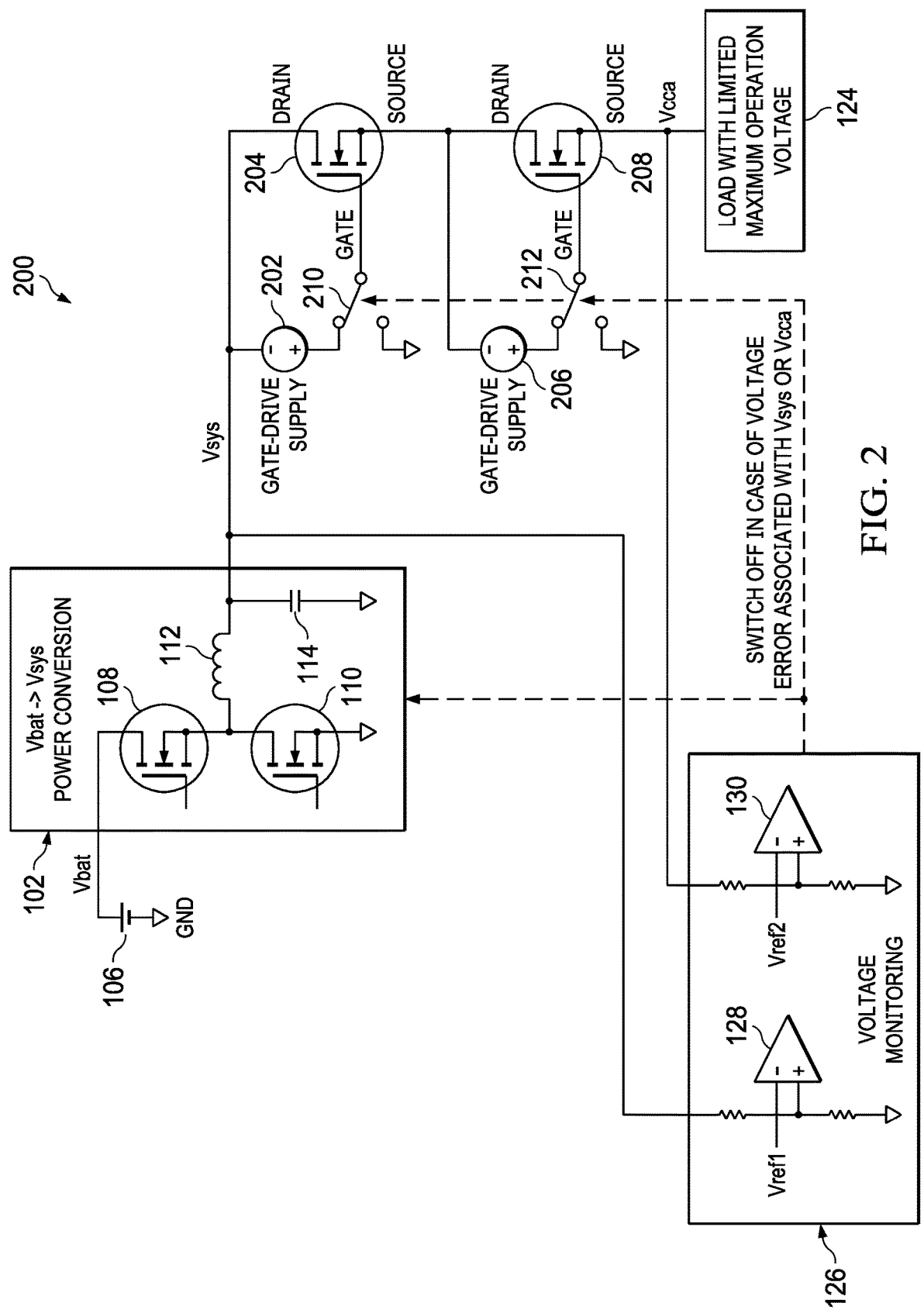
FIG. 2 is a schematic illustration of monitoring an input voltage and an output voltage associated with two typical MOSFETs in series with a typical power conversion stage.

FIG. 2 is a schematic illustration of monitoring a first output voltage (Vsys) and a second output voltage (Vcca) associated with a second typical power conversion system 200. The second power conversion system 200 includes the power source 106, the first power conversion stage 102, and the voltage monitoring circuit 126 of FIG. 1. In FIG. 2, the first power conversion stage 102 is coupled to a first typical gate-drive supply 202 and a fifth typical N-channel MOSFET 204. The fifth N-channel MOSFET 204 is coupled in series to a second typical gate-drive supply 206 and a sixth typical N-channel MOSFET 208. In FIG. 2, the first gate-drive supply 202 provides a first current to the fifth N-channel MOSFET 204 via a first typical switch 210. In FIG. 2, the second gate-drive supply 206 provides a second current to the sixth N-channel MOSFET 208 via a second typical switch 212.

In operation, the first comparator 128 of the voltage monitoring circuit 126 determines whether Vsys is greater than Vref1. The second comparator 130 of the voltage monitoring circuit 126 determines whether Vcca is greater than Vref2. In FIG. 2, Vcca corresponds to an output voltage of the sixth N-channel MOSFET 208. If the first comparator 128 determines that Vsys is greater than Vref1 or the second comparator 130 determines that Vcca is greater than Vref2, the voltage monitoring circuit 126 turns off the first power conversion stage 102 and disconnects the gate-drive supplies 202, 206 from the fifth and sixth N-channel MOSFETs 204, 208. In FIG. 2, the voltage monitoring circuit 126 disconnects the gate-drive supplies 202, 206 by turning off the switches 210, 212.

Disadvantageously, the second power conversion system 200 of FIG. 2 does not detect a fail short associated with the first and second N-channel MOSFETs 108, 110 or the fifth and sixth N-channel MOSFETs 204, 208 as the voltage monitoring circuit 126 detects voltage errors associated with Vsys and Vcca. The second power conversion system 200 of FIG. 2 is less power efficient due to heat loss associated with the fifth and sixth N-channel MOSFETs 204, 208. The second power conversion system 200 of FIG. 2 has increased cost because of the addition of the gate-drive supplies 202, 206, the fifth and sixth N-channel MOSFETs 204, 208, and the switches 210, 212. The second power conversion system 200 of FIG. 2 includes the fifth and sixth N-channel MOSFETs 204, 208 based on an assumption that a voltage error associated with Vcca is not based on a common root cause that causes a fail short in both the fifth and sixth N-channel MOSFETs 204, 208 at the same time.

Figure 3:
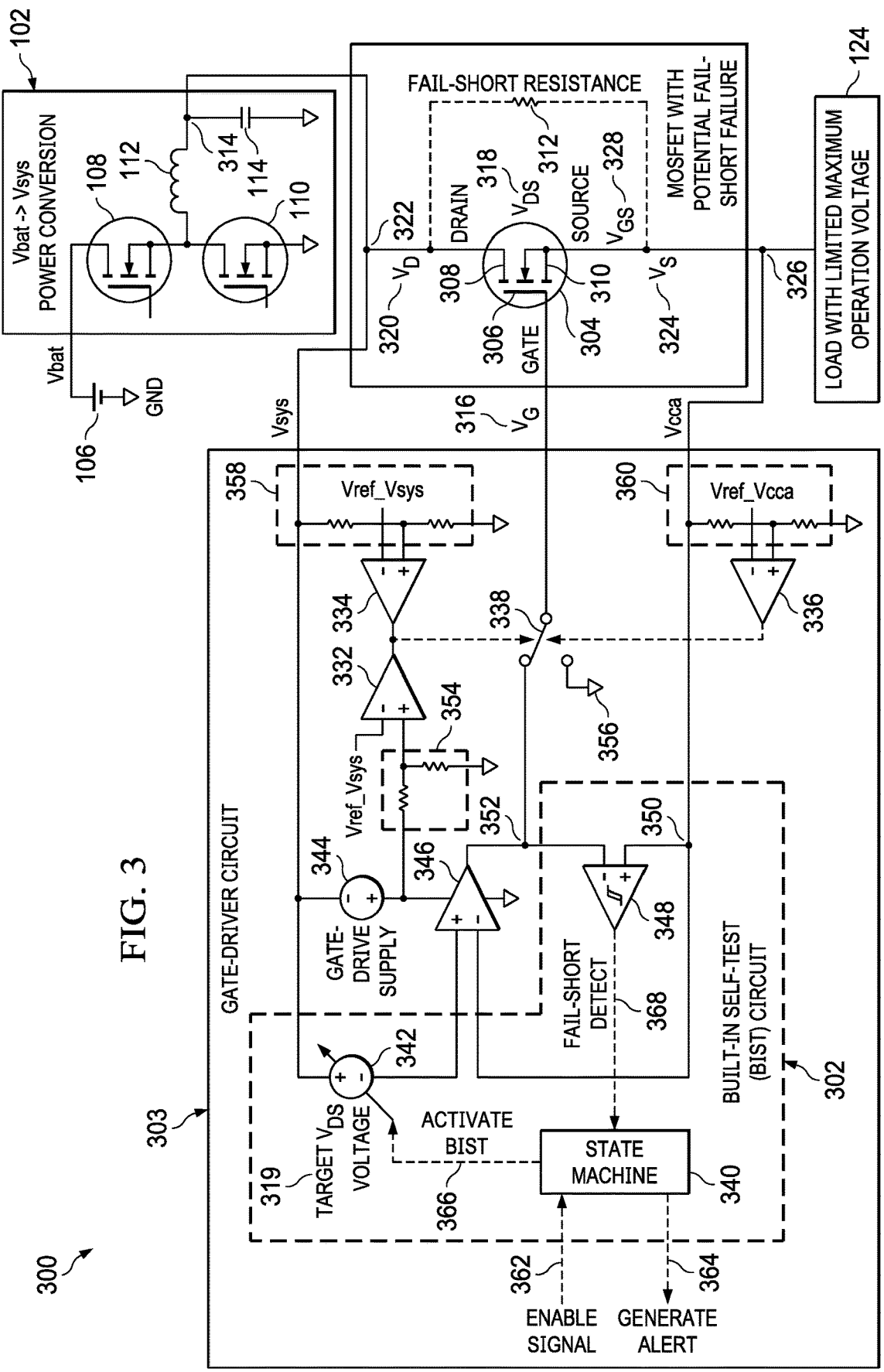
FIG. 3 is a schematic illustration of a first example built-in self-test circuit to detect a fail-short condition associated with an example MOSFET.

FIG. 3 is a schematic illustration of a third example power conversion system 300 including a first example built-in self-test (BIST) circuit 302 to detect a fail-short condition associated with an example transistor 304. In FIG. 3, a first example gate-driver circuit 303 includes the first BIST circuit 302. The first gate-driver circuit 303 is an integrated circuit (e.g., an integrated circuit chip). Alternatively, the first gate-driver circuit 303 may be implemented using hardware logic, machine readable instructions, hardware implemented state machines, and/or any combination thereof.

The third power conversion system 300 includes the power source 106 and the first power conversion stage 102 of FIG. 1. Further depicted as coupled to the third power conversion system 300 is the load 124 of FIG. 1. Alternatively, the load 124 may not be coupled to the third power conversion system 300. In FIG. 3, the transistor 304 is a power switching device. In FIG. 3, the transistor 304 is an N-channel enhancement mode MOSFET, or MOSFET 304. In some examples, the first power conversion stage 102, the first gate-driver circuit 303, and the MOSFET 304 are included in the same integrated circuit. Alternatively, one or more of the first power conversion stage 102, the first gate-driver circuit 303, and/or the MOSFET 304 may be included in separate integrated circuits.

The MOSFET 304 includes an example gate (e.g., a gate terminal) 306, an example drain (e.g., a current terminal, a drain terminal, etc.) 308, and an example source (e.g., a current terminal, a source terminal, etc.) 310. In FIG. 3, the MOSFET 304 has an associated example fail-short resistance 312 corresponding to a drain-to-source resistance of the MOSFET 304. In the illustrated example of FIG. 3, the drain 308 of the MOSFET 304 is coupled to the first inductor 112 and the first capacitor 114 of the first power conversion stage 102 at an example power conversion stage output node 314. The source 310 of the MOSFET 304 is coupled to the load 124.

In some examples, the load 124 is associated with a vehicle (e.g., an aerial vehicle, a land vehicle (e.g., an automobile), a marine vehicle, etc.). For example, the load 124 may be one or more components included in an ECU, and/or, more generally, the ECU of a vehicle. In such examples, the load 124 can correspond to one or more processors, non-volatile memory, volatile memory, etc., included in and/or otherwise associated with the ECU. In FIG. 3, the load 124 has a limited maximum operation voltage. For example, the load 124 may be designed to operate or function to operate to comply and/or otherwise satisfy a functional safety requirement, specification, standard, etc. Alternatively, the load 124 may not be restricted to a limited maximum operation voltage.

In the illustrated example of FIG. 3, the first-gate driver circuit 303, and/or, more generally, the third power conversion system 300 includes the first BIST circuit 302 to perform a BIST on the MOSFET 304 and the first BIST circuit 302 is to, when activated or enabled, control a voltage of the gate 306 (e.g., a gate voltage, $V_G$ 316, etc.) to regulate a voltage across the drain 308 and the source 310 (e.g., a drain-to-source voltage, $V_{DS}$ 318, etc.) to an example target voltage 319 (e.g., a target drain-to-source voltage 319, a target $V_{DS}$ 319, etc.). For example, the first BIST circuit 302 can perform a fail-short BIST or a BIST to detect a fail-short condition associated with the MOSFET 304. In FIG. 3, the target $V_{DS}$ 319 corresponds to a voltage across the variable voltage source 342.

In FIG. 3, $V_{DS}$ 318 corresponds to a voltage difference between an example drain voltage ($V_D$) 320 at an example drain node 322 and an example source voltage ($V_S$) 324 at an example source node 326. By regulating $V_{DS}$ 318, the first BIST circuit 302 can determine whether a voltage across the gate 306 and the source 310 (e.g., a gate-to-source voltage, $V_{GS}$ 328, etc.) performs a zero crossing. For example, the first BIST circuit 302 can determine whether $V_{GS}$ 328 moves from a positive voltage value to a negative voltage value in response to the first BIST circuit 302 regulating $V_{DS}$ 318. In FIG. 3, $V_{GS}$ 328 corresponds to a voltage difference between $V_G$ 316 and $V_S$ 324.

In the illustrated example of FIG. 3, the first gate-driver circuit 303 includes a first example comparator 332, a second example comparator 334, a third example comparator 336, an example switch 338, an example gate-drive supply 344, and an example amplifier 346. In FIG. 3, the first BIST circuit 302 includes a first example state machine 340, an example variable voltage source 342, and a fourth example comparator 348.

In some examples, the first BIST circuit 302 is an integrated circuit. For example, the first BIST circuit 302 can be included in a first integrated circuit and the first comparator 332, the second comparator 334, the third comparator 336, the switch 338, the gate-driver supply 344, the amplifier 346, a first example voltage divider 354, a second example voltage divider 358, and a third example voltage divider 360 are included in a second integrated circuit, where the first and second integrated circuits are included in a third integrated circuit corresponding to the first gate-driver circuit 303 or the power conversion system 300.

In the illustrated example of FIG. 3, the first gate-driver circuit 303 facilitates switching operations of the MOSFET 304 and, in some examples, triggers a BIST of the MOSFET 304. For example, the first gate-driver circuit 303 can direct the amplifier 346 to increase $V_G$ 316 to turn on the MOSFET 304 by causing $V_{GS}$ 328 to be higher than a turn-on voltage threshold of the MOSFET 304. In other examples, the first gate-driver circuit 303 can direct the amplifier 346 to decrease $V_G$ 316 to turn off the MOSFET 304 by causing $V_{GS}$ 328 to be lower than a turn-off voltage threshold of the MOSFET 304.

In the illustrated example of FIG. 3, the first state machine 340 is a hardware implemented finite state machine. For example, the first state machine 340 may correspond to one or more microcontrollers (e.g., one or more analog microcontrollers) that include analog peripherals for sensing and/or measurement functions. In such examples, the first state machine 340 can include one or more programmable gain amplifiers (PGAs), one or more comparators, one or more transimpedance amplifiers, one or more operational amplifiers, etc., and/or a combination thereof. In some examples, the first state machine 340 can correspond to one or more controllers (e.g., microcontrollers) that execute machine readable instructions. In some examples, the first state machine 340 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)).

In the illustrated example of FIG. 3, the variable voltage source 342 is coupled to the first state machine 340. For example, the variable voltage source 342 may be coupled to one or more pins of the first state machine 340. In FIG. 3, the variable voltage source 342, when enabled, generates a voltage drop across the variable voltage source 342 that corresponds to the target $V_{DS}$ 319 (e.g., 50 millivolts (mV), 100 mV, 200 mV, etc.). For example, when the target $V_{DS}$ 319 is 100 mV and Vsys is 5 Volts (V), the variable voltage source 342, when enabled, may drop the voltage at a non-inverting input (e.g., a non-inverting voltage input) of the amplifier 346 from 5 V to 4.9 V (e.g., 4.9 V=Vsys−target $V_{DS}$ 319 (e.g., 4.9 V=5 V−0.1 V)). In such examples, the amplifier 346 can decrease $V_G$ 316 to attempt reducing a difference between the inputs of the amplifier 346 to zero.

In some examples, the variable voltage source 342 is a variable resistor and the first state machine 340 can output a fixed quantity of current to generate a variable voltage. In some examples, the variable voltage source 342 is a resistor having a fixed resistance and the first state machine 340 can output a variable quantity of current to generate a variable voltage. In FIG. 3, the gate-drive supply 344 is a fixed voltage supply. For example, the gate-drive supply 344 may output a voltage that is 12 V higher than the output voltage of the first power conversion stage 102 (e.g., Vsys). In such examples, the gate-drive supply 344 can output a voltage of approximately 17 V when Vsys is 5 V. Alternatively, the gate-drive supply 344 may output a different voltage. Alternatively, the gate-drive supply 344 may be implemented with any kind of step-up converter. For example, the gate-drive supply 344 can be a capacitive charge pump, an inductive boost-converter, etc.

In the illustrated example of FIG. 3, the amplifier 346 is an operational amplifier. The non-inverting input of the amplifier 346 is coupled to a negative terminal of the variable voltage source 342 and an inverting input (e.g., an inverting voltage input) of the amplifier 346 is coupled to the fourth comparator 348 at a first example node 350. The inverting input of the amplifier 346 has a voltage corresponding to $V_S$ 324. A power input terminal of the amplifier 346 is coupled to a positive terminal of the gate-drive supply 344 and an output of the amplifier 346 is coupled to the gate 306 of the MOSFET 304 via the switch 338. In operation, the amplifier 346 can output a voltage proximate the voltage associated with the gate-drive supply 344 when the non-inverting input is greater than the inverting input. The amplifier 346 can output a voltage proximate a voltage associated with an example ground rail 356 when the inverting input is greater than the non-inverting input. In FIG. 3, the fourth comparator 348 is a Schmitt trigger. Alternatively, the fourth comparator 348 may be any other type of comparator. A first input of the fourth comparator 348 is coupled to the first node 350 and a second input of the fourth comparator 348 is coupled to the output of the amplifier 346 at a second example node 352.

In the illustrated example of FIG. 3, the first comparator 332 and the second comparator 334 are voltage comparators. In FIG. 3, an output terminal of the first comparator 332 is coupled to an output terminal of the second comparator 334. The first comparator 332 compares (1) an output voltage of the gate-drive supply 344 that is scaled by the first voltage divider 354 to generate a first comparison voltage to (2) a first reference voltage (Vref_Vsys). Vref_Vsys corresponds to a reference voltage. A voltage based on a multiplication of Vref_Vsys and a first scaling factor associated with the first voltage divider 354 corresponds to a voltage threshold above which is indicative of a fault with the gate-drive supply 344. For example, if the gate-drive supply 344 fails and provides a higher than typical gate-drive voltage to the power input terminal of the amplifier 346, the first comparator 332 can assert a logic High to switch the switch 338. By switching the switch 338, $V_G$ 316 is pulled down to the ground rail 356 to turn off the MOSFET 304. For example, the first comparator 332 can switch the switch 338 based on the output of the gate-drive supply 344 scaled by the first voltage divider 354 being greater than a voltage threshold (e.g., Vref_Vsys).

In the illustrated example of FIG. 3, the second comparator 334 compares (1) Vsys scaled by the second voltage divider 358 to generate a second comparison voltage to (2) Vref_Vsys. A voltage based on a multiplication of Vref_Vsys and a second scaling factor associated with the second voltage divider 358 corresponds to a voltage threshold above which is indicative of a fault with the first power conversion stage 102. The second comparator 334 asserts a logic High to switch the switch 338 when Vsys scaled by the second voltage divider 358 is greater than Vref_Vsys. By switching the switch 338, $V_G$ 316 is pulled to the ground rail 356 to turn off the MOSFET 304. For example, if the first power conversion stage 102 fails and generates a higher than typical Vsys, the second comparator 334 can switch the switch 338 based on Vsys scaled by the second voltage divider 358 being greater than the voltage threshold (e.g., Vref_Vsys).

In FIG. 3, the third comparator 336 compares (1) the source voltage 324 (also denoted as Vcca) scaled by the third voltage divider 360 to generate a third comparison voltage to (2) a second reference voltage (Vref_Vcca). A voltage based on a multiplication of Vref_Vcca and a third scaling factor associated with the third voltage divider 360 corresponds to a voltage threshold above which is indicative of a fault with the first power conversion stage 102. For example, if the first power conversion stage 102 fails and generates a higher than typical Vsys, and the second comparator 334 fails to detect this failure, $V_S$ 324 will be higher than typical Vcca, and the third comparator 336 can assert a logic High to change a state of the switch 338. By changing the state of the switch 338, $V_G$ 316 is pulled to the ground rail 356 to turn off the MOSFET 304. In FIG. 3, the third comparator 336 is a voltage comparator. Alternatively, the third comparator 336 may be any other type of comparator.

In some examples, the first state machine 340 triggers, enables, and/or otherwise activates a BIST in response to an example enable signal 362. For example, the enable signal 362 can be a control signal, a BIST trigger (e.g., a BIST trigger signal), a BIST enable signal, etc. In some examples, the enable signal 362 is generated by an external controller, state machine, etc. In other examples, the enable signal 362 can be generated by an engine ignition or power train ignition operation when the load 124 is associated with a vehicle. For example, when a driver or user of an automobile turns on the ignition, the ignition may cause a logic High to be asserted for the enable signal 362.

In FIG. 3, the first state machine 340 generates an example alert signal 364 to indicate the MOSFET 304 having a fail short. For example, the fourth comparator 348 may assert an example fail-short detection signal 368 (e.g., assert a signal corresponding to a logic High) when a fail short of the MOSFET 304 is detected. In such examples, the fourth comparator 348 can assert the fail-short detection signal 368 when $V_G$ 316 is less than $V_S$ 324 corresponding to $V_{GS}$ 328 being negative (e.g., the MOSFET 304 performing a zero crossing). In response to the fourth comparator 348 asserting the fail-short detection signal 368, the first state machine 340 generates the alert signal 364. In some examples, the alert signal 364 is transmitted to a controller, a hardware-implemented state machine, a logic circuit, etc., coupled to and/or otherwise in circuit with the first gate-driver circuit 303. For example, the first state machine 340 may assert the alert signal 364 when a fail short of the MOSFET 304 is detected.

In operation, the amplifier 346 turns on the MOSFET 304 by outputting a voltage of $V_G$ 316 to cause $V_{GS}$ 328 to be greater than the turn-on voltage threshold of the MOSFET 304. When the MOSFET 304 is on and a BIST is not being performed, $V_{DS}$ 318 is approximately zero because $V_D$ 320 and $V_S$ 324 are approximately Vsys. Accordingly, the non-inverting input and inverting input of the amplifier 346 are approximately Vsys. The first state machine 340 activates a BIST of the MOSFET 304 when the enable signal 362 corresponds to a logic High. In response to the enable signal 362 being asserted, the first state machine 340 generates an example control signal 366 to direct the variable voltage source 342 to generate the target $V_{DS}$ 319 across the variable voltage source 342 and cause a voltage at the non-inverting input of the amplifier 346 to decrease by the target $V_{DS}$ 319.

When the non-inverting input of the amplifier 346 has a voltage that is less than a voltage of the inverting input of the amplifier 346, the amplifier 346 attempts to regulate $V_{DS}$ 318 to the target $V_{DS}$ 319 by reducing $V_G$ 316 (e.g., from a first voltage proximate a voltage of the gate-drive supply 344 to a second voltage proximate a voltage of the ground rail 356). If the MOSFET 304 does not have a fail short, the amplifier 346 reduces $V_G$ 316, which causes $V_{GS}$ 328 to decrease until $V_{DS}$ 318 increases to the target $V_{DS}$ 319. When $V_{DS}$ 318 reaches the target $V_{DS}$ 319, the amplifier 346 stops reducing and/or otherwise maintains $V_G$ 316 at the current voltage level. After a quantity of time associated with a BIST timer (e.g., a BIST timer period) has elapsed, the first state machine 340 determines that the MOSFET 304 does not have a fail short and turns off the control signal 366. For example, the fourth comparator 348 may not assert the fail-short detection signal 368 because $V_G$ 316 is greater than $V_S$ 324 when the BIST timer has elapsed. In some examples, the first state machine 340 includes a counter to execute and/or otherwise facilitate operation of the BIST timer and determining whether a BIST timer period has elapsed.

If the MOSFET 304 does have a fail short, the amplifier 346 reduces $V_G$ 316, which causes $V_{GS}$ 328 to decrease until $V_G$ 316 approaches the voltage associated with the ground rail 356. For example, the amplifier 346 may reduce $V_G$ 316 until the amplifier 346 is unable to reduce $V_G$ 316 any further because $V_{DS}$ 318 does not increase to the target $V_{DS}$ 319. For example, $V_{DS}$ 318 may not increase to the target $V_{DS}$ 319 because the MOSFET 318 has a fail short (e.g., the fail-short resistance 312 is in a range of 0-10 ohms, a range of 0-20 ohms, etc.) and a reduction in $V_G$ 316 does not cause a corresponding increase in $V_{DS}$ 318. While reducing $V_G$ 316, a zero crossing of $V_{GS}$ 328 may occur when $V_G$ 316 decreases below $V_S$ 324. For example, the fourth comparator 348 may detect the zero crossing and assert the fail-short detection signal 368 and transmit the asserted fail-short detection signal to the first state machine 340. When the first state machine 340 determines that the MOSFET 304 has a fail short based on the assertion of the fail-short detection signal 368, the first state machine 340 asserts the alert signal 364.

While an example manner of implementing the first gate-driver circuit 303 is illustrated in FIG. 3, one or more of the elements, processes, and/or devices illustrated in FIG. 3 may be combined, divided, re-arranged, omitted, eliminated, and/or implemented in any other way. Further, the first comparator 332, the second comparator 334, the third comparator 336, the switch 338, the first state machine 340, the variable voltage supply 342, the gate-drive supply 344, the amplifier 346, the fourth comparator 348, the first voltage divider 354, the second voltage divider 358, the third voltage divider 360, and/or, more generally, the first gate-driver control circuit 303 of FIG. 3 may be implemented by hardware, software, firmware, and/or any combination of hardware, software, and/or firmware. Thus, for example, any of the first comparator 332, the second comparator 334, the third comparator 336, the switch 338, the first state machine 340, the variable voltage supply 342, the gate-drive supply 344, the amplifier 346, the fourth comparator 348, the first voltage divider 354, the second voltage divider 358, the third voltage divider 360, and/or, more generally, the first gate-driver circuit 303 could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the first comparator 332, the second comparator 334, the third comparator 336, the switch 338, the first state machine 340, the variable voltage supply 342, the gate-drive supply 344, the amplifier 346, the fourth comparator 348, the first voltage divider 354, the second voltage divider 358, the third voltage divider 360, and/or, more generally, the first gate-driver circuit 303 is/are hereby expressly defined to include a non-transitory computer readable storage device or storage disk such as non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc., and/or any other type of random access memory (RAM) device), etc., including the software and/or firmware. Further still, the first gate-driver circuit 303 of FIG. 3 may include one or more elements, processes, and/or devices in addition to, or instead of, those illustrated in FIG. 3, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4A:
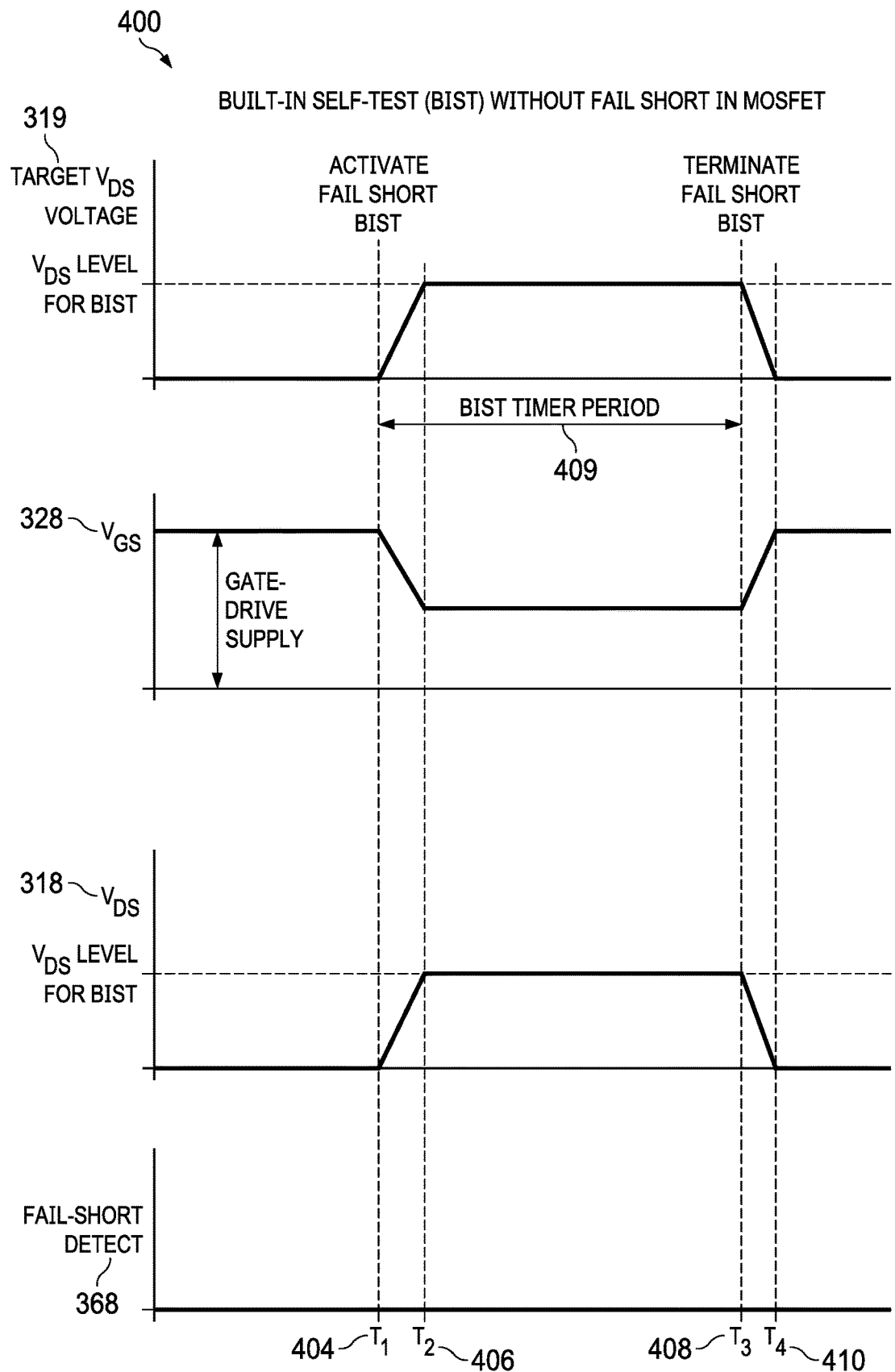
FIG. 4A depicts a first example timing diagram corresponding to operation of the first example built-in self-test circuit of FIG. 3.
Figure 4B:
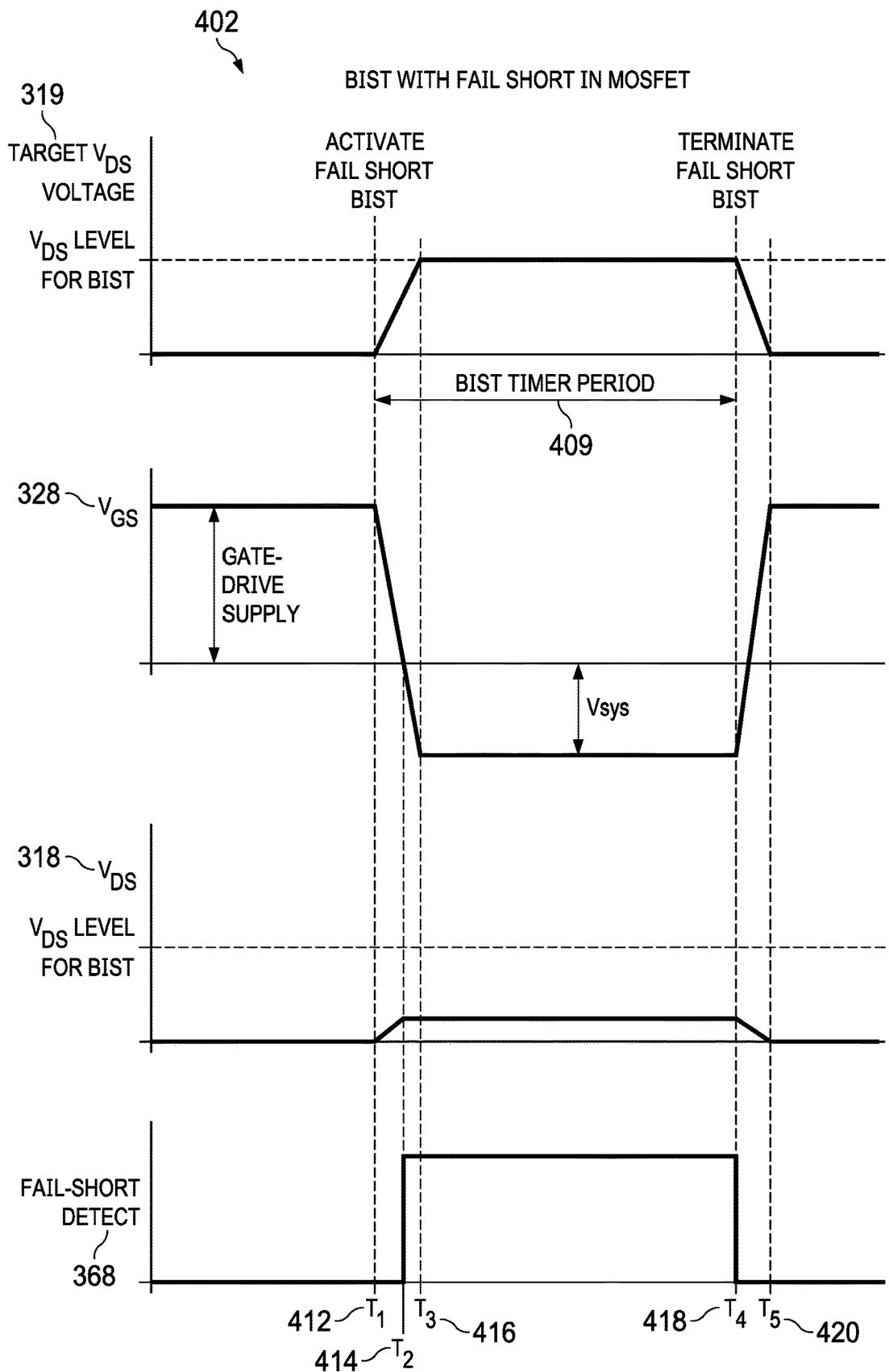
FIG. 4B depicts a second example timing diagram corresponding to operation of the first example built-in self-test circuit of FIG. 3.

FIG. 4A depicts a first example timing diagram 400 and FIG. 4B depicts a second example timing diagram 402 corresponding to operation of the first BIST circuit 302, and/or, more generally, the first gate-driver circuit 303 of FIG. 3. In FIG. 4A, the first timing diagram 400 corresponds to operation of the first BIST circuit 302 when the MOSFET 304 of FIG. 3 does not have a fail short. In FIG. 4B, the second timing diagram 402 corresponds to operation of the first BIST circuit 302 when the MOSFET 304 has a fail short. Depicted in the timing diagrams 400, 402 of FIGS. 4A-4B are example waveforms for the target $V_{DS}$ 319, $V_{GS}$ 328, $V_{DS}$ 318, and the fail-short detection signal 368 of FIG. 3.

In the first timing diagram 400, at a first example time $(T_1)$ 404, the enable signal 362 of FIG. 3 can be asserted (e.g., from an automobile ignition). In response to the assertion, the first state machine 340 of FIG. 3 can trigger a BIST by generating the control signal 366 of FIG. 3 to direct the variable voltage source 342 of FIG. 3 to increase a voltage across the variable voltage source 342 to the target $V_{DS}$ 319. In the first timing diagram 400, at the first time 404, the amplifier 346 of FIG. 3 can decrease $V_G$ 316 of FIG. 3 to attempt regulating $V_{DS}$ 318 to the target $V_{DS}$ 319. In the first timing diagram 400, $V_{GS}$ 328 corresponds to a voltage of the gate-drive supply 344 of FIG. 3.

In the first timing diagram 400, at a second example time $(T_2)$ 406, $V_{DS}$ 318 reaches the target $V_{DS}$ 319 corresponding to a voltage level of the $V_{DS}$ 318 for the BIST. In the first timing diagram 400, the amplifier 346 reduces $V_G$ 316 from the first time 404 to the second time 406 to cause $V_{GS}$ 328 to be reduced from a first voltage at the first time 404 to a second voltage at the second time 406. At the second time 406, the amplifier 346 stops reducing $V_G$ 316 to maintain $V_{GS}$ 328 at the second voltage. In the first timing diagram 400, $V_{GS}$ 328 is positive at the first time 404 and the second time 406. Accordingly, a zero crossing of the MOSFET 304 in the first timing diagram did not occur.

In the first timing diagram 400, at a third example time $(T_3)$ 408, the first state machine 340 can de-assert the control signal 366 to cause the target $V_{DS}$ 319 of the variable voltage source 342 to reduce to zero at a fourth example time $(T_4)$ 410. At the third time 408, the amplifier 346 increases $V_G$ 316 to cause $V_{GS}$ 328 to increase back to a voltage level before triggering the BIST (e.g., $V_{GS}$ 328 at the first time 404). In the first timing diagram 400, an example BIST timer period 409 begins at the first time 404 and ends at the third time 408. For example, the first state machine 340 may start the BIST timer period 409 (e.g., trigger or instantiate the BIST timer period 409 using a counter included in the first state machine 340) in response to asserting the control signal 366 and de-assert the control signal 366 when the BIST timer period 409 has ended. For example, the first state machine 340 may activate the fail-short BIST at the first time 404 and terminate the fail-short at the third time 408. In the first timing diagram 400, the fail-short detection signal 368 is not asserted because $V_{GS}$ 328 did not cross zero during the BIST timer period 409.

In the second timing diagram 402, at a first example time $(T_1)$ 412, the enable signal 362 can be asserted (e.g., from an automobile ignition). In response to the assertion, the first state machine 340 can trigger a BIST by generating the control signal 366 to direct the variable voltage source 342 to increase in voltage to the target $V_{DS}$ 319. In the second timing diagram 402, at the first time 412, the BIST timer period 409 begins. In the second timing diagram 402, at the first time 412, the amplifier 346 can decrease $V_G$ 316 to attempt regulating $V_{DS}$ 318 to the target $V_{DS}$ 319.

In the second timing diagram 402, at a second example time $(T_2)$ 414, $V_{DS}$ 318 does not reach the target $V_{DS}$ 319 corresponding to the voltage level of the $V_{DS}$ 318 for the BIST. In the second timing diagram 402, the amplifier 346 reduces $V_G$ 316 from the first time 412 to the second time 414 to cause $V_{GS}$ 328 to be reduced from a first voltage at the first time 412 to a second voltage at the second time 414. In the second timing diagram 402, the first voltage corresponds to a voltage of the gate-drive supply 344 and the second voltage is approximately zero. At the second time 414, the amplifier 346 continues to reduce $V_G$ 316 because $V_{DS}$ 318 has not reached the target $V_{DS}$ 319. When $V_{GS}$ 328 reduces below zero (e.g., at approximately the second time 414), the fourth comparator 348 asserts the fail-short detection signal 368. For example, the first state machine 340 can determine the MOSFET 304 has a fail-short failure based on the assertion of the fail-short detection signal 368. In such examples, the first state machine 340 can assert the alert signal 364 of FIG. 3 based on the assertion of the fail-short detection signal 368. In the second timing diagram 402, at a third example time $(T_3)$ 416, the amplifier 346 reduces $V_G$ 316 to approximately zero and, thus, causes $V_{GS}$ 328 to become −Vsys because $V_G$ 316 is zero and $V_S$ 324 of FIG. 3 is Vsys.

In the second timing diagram 402, at a fourth example time $(T_4)$ 418, the BIST timer period 409 ends and the first state machine 340 de-asserts the fail-short detection signal 368. At the fourth time 418, the alert signal 364 remains asserted after the BIST timer period 409 expires. When the BIST timer period 409 ends, the first state machine 340 de-asserts the control signal 166 and reduces the target $V_{DS}$ 319 associated with the variable voltage source 342 to zero. When the variable voltage source 342 is not enabled, the amplifier 346 increases $V_G$ 316 to cause $V_{DS}$ 318 to decrease. At a fifth example time ($T_5$) 420, the amplifier 346 increases $V_G$ 316 to cause $V_{GS}$ 328 to increase back to a voltage level before triggering the BIST (e.g., $V_{GS}$ 328 at the first time 412).

Figure 5:
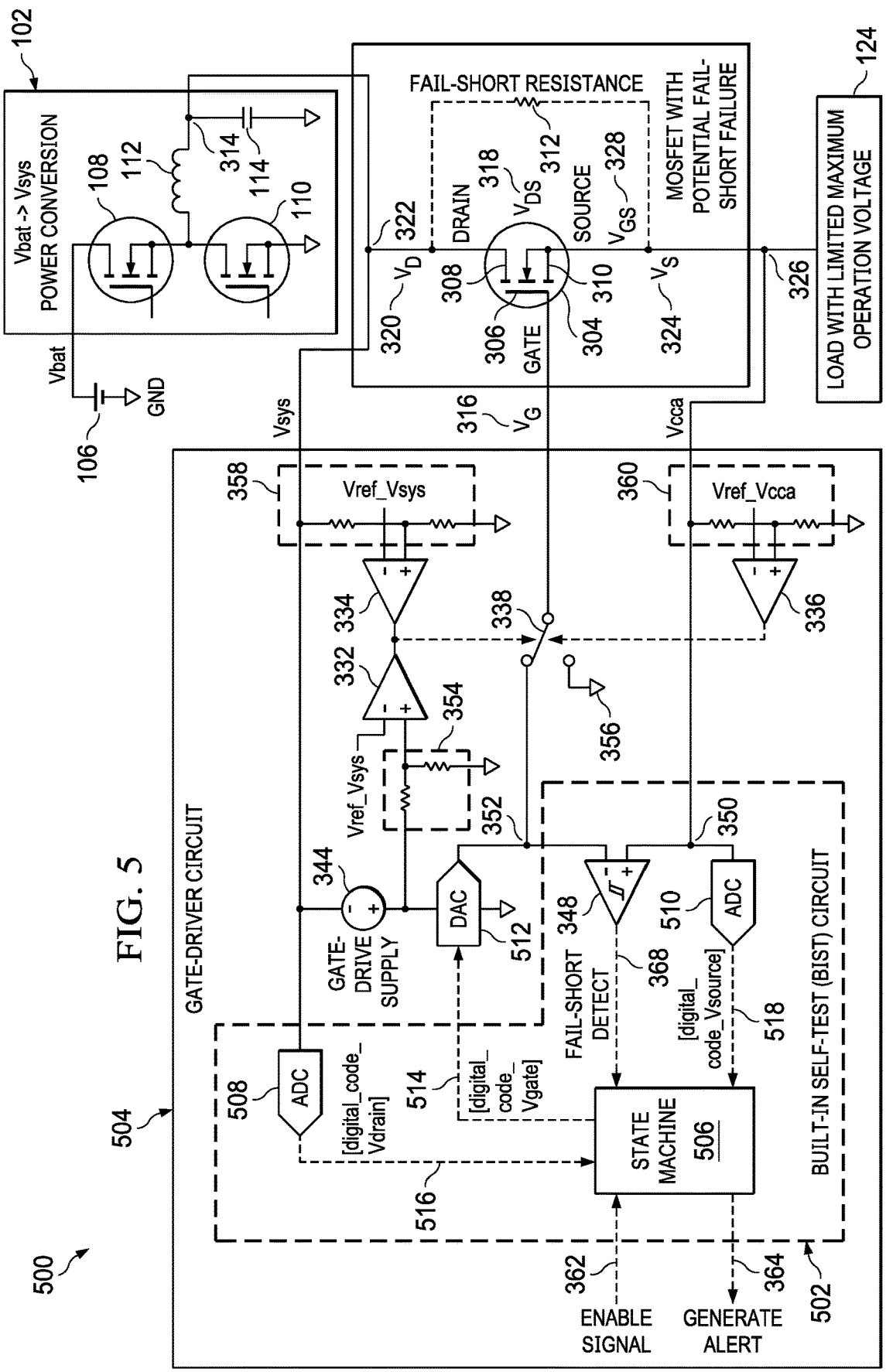
FIG. 5 is a schematic illustration of a second example built-in self-test circuit to detect a fail-short condition associated with the example MOSFET of FIG. 3.

FIG. 5 is a schematic illustration of a fourth example power conversion system 500 including a second example BIST circuit 502 to detect a fail-short condition associated with the MOSFET 304 of FIG. 3. In FIG. 5, a second example gate-driver circuit 504 includes the second BIST circuit 502. In FIG. 5, the second gate-driver circuit 504 is an integrated circuit (e.g., an integrated circuit chip). Alternatively, the second gate-driver circuit 504 may be implemented using hardware logic, machine readable instructions, hardware implemented state machines, and/or any combination thereof.

The fourth power conversion system 500 includes the power source 106 and the first power conversion stage 102 of FIG. 1. Further depicted as coupled to the fourth power conversion system 500 is the load 124 of FIG. 1. Alternatively, the load 124 may not be coupled to the fourth power conversion system 500. The fourth power conversion system 500 includes the MOSFET 304 of FIG. 3. In some examples, the first power conversion stage 102, the second gate-driver circuit 504, and the MOSFET 304 are included in the same integrated circuit. Alternatively, one or more of the first power conversion stage 102, the second gate-driver circuit 504, and/or the MOSFET 304 may be included in separate integrated circuits.

In the illustrated example of FIG. 5, the second gate-driver circuit 504, and/or, more generally, the fourth power conversion system 500 includes the second BIST circuit 502 to perform a BIST on the MOSFET 304 and the second BIST circuit 502 is to, when activated or enabled, control $V_G$ 316 to regulate $V_{DS}$ 318 to a target voltage (e.g., a target drain-to-source voltage, a target $V_{DS}$, etc.). In the illustrated example of FIG. 5, the second gate-driver circuit 504 includes the first comparator 332, the second comparator 334, the third comparator 336, the switch 338, the gate-drive supply 344, the first voltage divider 354, the second voltage divider 358, and the third voltage divider 360 of FIG. 3, and an example digital-to-analog (DAC) converter 512. In FIG. 5, the DAC 512 is a 12-bit voltage output DAC. Alternatively, the DAC 512 may have a different resolution and/or have a different type of output (e.g., a current output).

In the illustrated example of FIG. 5, the second gate-driver circuit 504 facilitates switching operations of the MOSFET 304 and, in some examples, triggers a BIST of the MOSFET 304. For example, the second gate-driver circuit 504 can instruct the DAC 512 to increase $V_G$ 316 to turn on the MOSFET 304 by causing $V_{GS}$ 328 to be higher than a turn-on voltage threshold of the MOSFET 304. In other examples, the second gate-driver circuit 504 can direct the DAC 512 to decrease $V_G$ 316 to turn off the MOSFET 304 by causing $V_{GS}$ 328 to be lower than a turn-off voltage threshold of the MOSFET 304.

In the illustrated example of FIG. 5, the second BIST circuit 502 includes a second example state machine 506, a first example analog-to-digital (ADC) converter 508, a second example ADC 510, and the fourth comparator 348 of FIG. 3. In FIG. 5, the first ADC 508 and the second ADC 510 are 12-bit 200 kilo-samples per second (ksps) successive-approximation-register (SAR) ADC. Alternatively, one or both ADCs 508, 510 may have a different resolution, sampling rate, and/or otherwise correspond to a different type of ADC.

In some examples, the second BIST circuit 502 is an integrated circuit. For example, the second BIST circuit 502 can be included in a first integrated circuit and the first comparator 332, the second comparator 334, the third comparator 336, the switch 338, the gate-drive supply 344, the first voltage divider 354, the second voltage divider 358, the third voltage divider 360, and/or the DAC 512 are included in a second integrated circuit, where the first and second integrated circuits are included in a third integrated circuit corresponding to the second gate-driver circuit 504 or the fourth power conversion system 500.

In the illustrated example of FIG. 5, an output of the first ADC 508 is coupled to the second state machine 506 and an input of the first ADC 508 is coupled to a negative terminal of the gate-drive supply 344, the second voltage divider 358, and an output of the first power conversion stage 102 of FIG. 1 at the drain node 322 of FIG. 3. In FIG. 5, the second state machine 506 is coupled to an input of the DAC 512. In FIG. 5, a positive terminal of the gate-drive supply 344 is coupled to a power input of the DAC 512. In FIG. 5, a ground or reference input of the DAC 512 is coupled to the ground rail 356. In FIG. 5, an output of the DAC 512 is coupled to the inverting input of the fourth comparator 348. In FIG. 5, the output of the DAC 512 is coupled to the gate 306 of the MOSFET 304 via the switch 338. In FIG. 5, an input of the second ADC 510 is coupled to the non-inverting input of the fourth comparator 348 at the first node 350. In FIG. 5, the input of the second ADC 510 is coupled to the third voltage divider 360. In FIG. 5, the input of the second ADC 510 is coupled to the source 310 and the load 124 at the source node 326. In FIG. 5, an output of the ADC 510 is coupled to the second state machine 506.

In the illustrated example of FIG. 5, the second state machine 506 is a hardware implemented finite state machine. For example, the second state machine 506 may correspond to one or more microcontrollers (e.g., one or more digital microcontrollers) that include analog and/or digital peripherals for sensing and/or measurement functions. In such examples, the second state machine 506 can include one or more ADCs, one or more DACs, one or more programmable gain amplifiers (PGAs), one or more comparators, one or more transimpedance amplifiers, one or more operational amplifiers, etc., and/or a combination thereof. In some examples, the second state machine 506 can correspond to one or more controllers (e.g., microcontrollers) that execute machine readable instructions. In some examples, the second state machine 506 could be implemented by one or more analog or digital circuit(s), logic circuits, programmable processor(s), programmable controller(s), GPU(s), DSP(s), ASIC(s), PLD(s), and/or FPLD(s).

In operation, the second state machine 506 triggers, enables, and/or otherwise activates a BIST of the MOSFET 304 in response to an assertion of the enable signal 362 of FIG. 3. In some examples, the second state machine 506 includes a counter to execute and/or otherwise facilitate operation of the BIST timer and determining whether a BIST timer period has elapsed. For example, the second state machine 506 may initialize a counter to start the BIST timer period when the enable signal 362 is asserted.

In the illustrated example of FIG. 5, in response to the assertion of the enable signal 362, the second state machine 506 generates a first example digital signal 514 to the DAC 512. In FIG. 5, the first digital signal 514 is a control signal. In FIG. 5, the first digital signal 514 corresponds to a digital code (digital_code_Vgate) that, when obtained by the DAC 512, is converted to an output voltage. For example, prior to the second state machine 506 triggering a BIST, the second state machine 506 may generate a first digital code that, when obtained by the DAC 512, is converted by the DAC 512 to output a first voltage for $V_G$ 316, where the first voltage is 17 V (e.g., 12 V above Vsys, where Vsys is 5 V). When the second state machine 506 triggers the BIST, the second state machine 506 may generate a second digital code to be converted by the DAC 512 to output a second voltage for $V_G$ 316 of 8 V. For example, the second state machine 506 may direct the DAC 512 to output the second voltage less than the first voltage to regulate $V_{DS}$ 318 during the BIST.

In the illustrated example of FIG. 5, the second state machine 506 obtains measurements associated with the MOSFET 304 via a second example digital signal (digital_code_Vdrain) 516 and a third example digital signal (digital_code_Vsource) 518. In FIG. 5, the first ADC 508 generates the second digital signal 516 by converting $V_D$ 320, which corresponds to Vsys, to a digital code (e.g., a binary value, a hexadecimal value, a machine readable value, etc.). For example, the second state machine 506 may determine $V_D$ 320 by decoding a digital code associated with the second digital signal 516. In FIG. 5, the second ADC 510 generates the third digital signal 518 by converting $V_S$ 324, which corresponds to Vcca, to a digital code. For example, the second state machine 506 may determine $V_S$ 324 by decoding a digital code associated with the third digital signal 518. In such examples, the second state machine 506 can determine $V_{DS}$ 318 based on a difference between (1) $V_D$ 320 indicated by the second digital signal 516 and (2) $V_S$ 324 indicated by the third digital signal 518.

In some examples, the second state machine 506 performs and/or otherwise facilitates the BIST of the MOSFET 304 by generating digital codes for the first digital signal 514 that sequentially and/or iteratively reduce $V_G$ 316 until $V_{DS}$ 318 satisfies a threshold (e.g., a pre-determined voltage threshold, a value of a voltage threshold stored in memory of the second state machine 506, etc.). For example, the second state machine 506 may generate a first digital code as the first digital signal 514 to cause the DAC 512 to output a first voltage for $V_G$ 316. In such examples, the second state machine 506 can determine $V_{DS}$ 318 based on a difference between the second digital signal 516 and the third digital signal 518 responsive to the first voltage being applied to the gate 306 of the MOSFET 304.

If $V_{DS}$ 318 does not satisfy a $V_{DS}$ threshold, the second state machine 506 can generate a second digital code as the first digital signal 514 to cause the DAC 512 to output a second voltage for $V_G$ 316, where the second voltage is less than the first voltage. In some examples, the second state machine 506 can generate (e.g., repeatedly generate) new digital codes as the first digital signal 514 to cause the DAC 512 to reduce $V_G$ 316 until at least one of the BIST timer expiring, $V_{GS}$ 328 becoming negative and causing a zero crossing to occur, or $V_{DS}$ 318 satisfying the $V_{DS}$ threshold. For example, when the reduction in $V_G$ 316 to the second voltage causes $V_{GS}$ 328 to become negative and causing the zero crossing to occur, the fourth comparator 348 can assert the fail-short detection signal 368 to the second state machine 506. Accordingly, the second state machine 506 can assert the alert signal 364 when the fail-short detection signal 368 is asserted.

If $V_{DS}$ 318 satisfies the $V_{DS}$ threshold, the second state machine 506 can maintain $V_G$ 316 at the second voltage (e.g., by not generating a different digital code as the first digital signal 514). For example, the second state machine 506 can maintain $V_G$ 316 at the second voltage until a BIST timer expires. When the BIST timer expires and $V_{DS}$ 318 satisfies the $V_{DS}$ threshold, the second state machine 506 can determine that the MOSFET 304 does not have a fail short. For example, the second state machine 506 may generate a third digital code as the first digital signal 514 to terminate the BIST by directing the DAC 512 to output the first voltage as $V_G$ 316.

While an example manner of implementing the second gate-driver circuit 504 is illustrated in FIG. 5, one or more of the elements, processes, and/or devices illustrated in FIG. 5 may be combined, divided, re-arranged, omitted, eliminated, and/or implemented in any other way. Further, the first comparator 332, the second comparator 334, the third comparator 336, the switch 338, the gate-drive supply 344, the fourth comparator 348, the first voltage divider 354, the second voltage divider 358, the third voltage divider 360, the second state machine 506, the first ADC 508, the second ADC 510, the DAC 512, and/or, more generally, the second gate-driver circuit 504 of FIG. 5 may be implemented by hardware, software, firmware, and/or any combination of hardware, software, and/or firmware. Thus, for example, any of the first comparator 332, the second comparator 334, the third comparator 336, the switch 338, the gate-drive supply 344, the fourth comparator 348, the first voltage divider 354, the second voltage divider 358, the third voltage divider 360, the second state machine 506, the first ADC 508, the second ADC 510, the DAC 512, and/or, more generally, the second gate-driver circuit 504 could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the first comparator 332, the second comparator 334, the third comparator 336, the switch 338, the gate-drive supply 344, the fourth comparator 348, the first voltage divider 354, the second voltage divider 358, the third voltage divider 360, the second state machine 506, the first ADC 508, the second ADC 510, the DAC 512, and/or, more generally, the second gate-driver circuit 504 is/are hereby expressly defined to include a non-transitory computer readable storage device or storage disk such as non-volatile memory, volatile memory, etc., including the software and/or firmware. Further still, the second gate-driver circuit 504 of FIG. 5 may include one or more elements, processes, and/or devices in addition to, or instead of, those illustrated in FIG. 5, and/or may include more than one of any or all of the illustrated elements, processes, and devices.

Figure 6A:
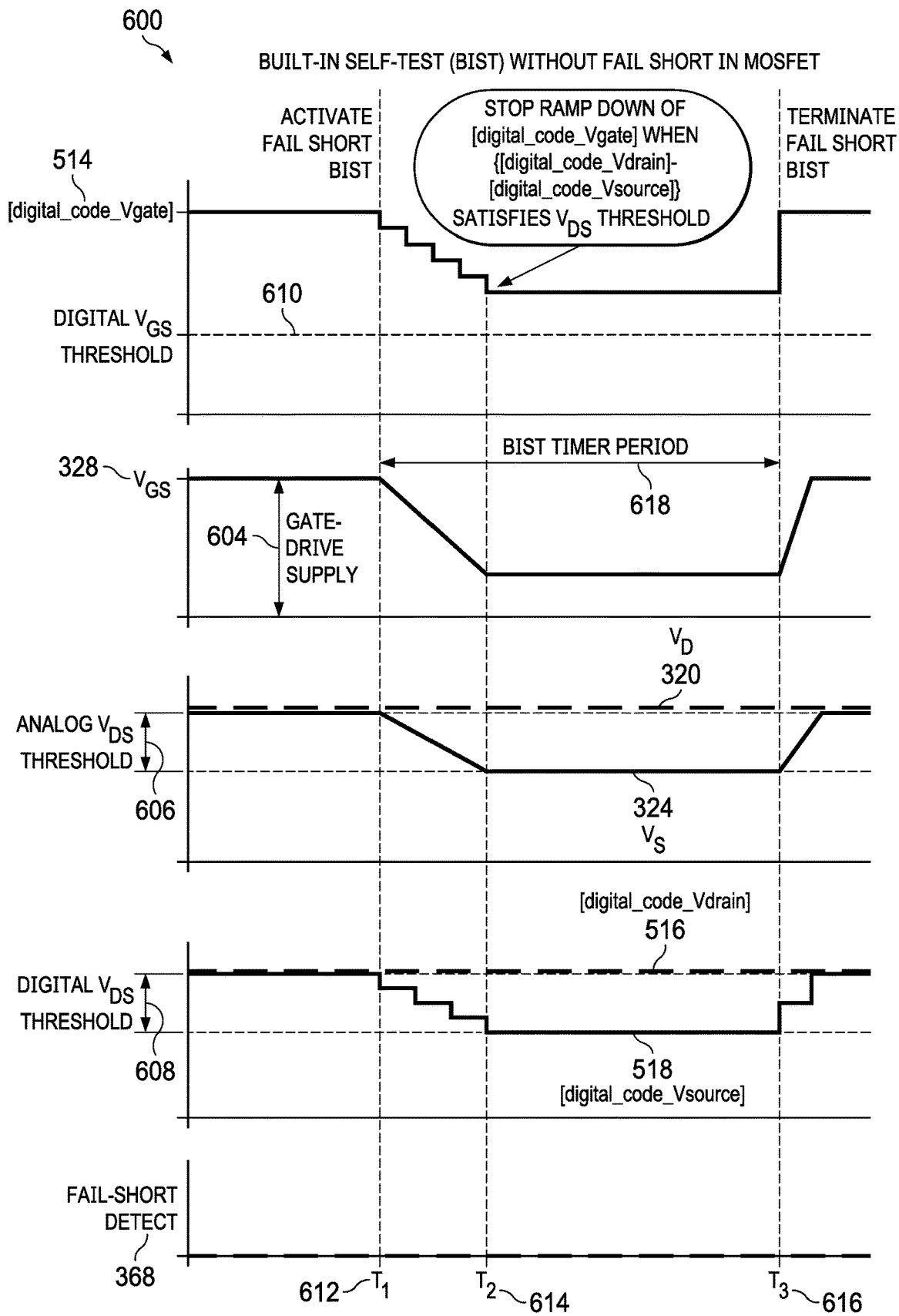
FIG. 6A depicts a third example timing diagram corresponding to operation of the second example built-in self-test circuit of FIG. 5.
Figure 6B:
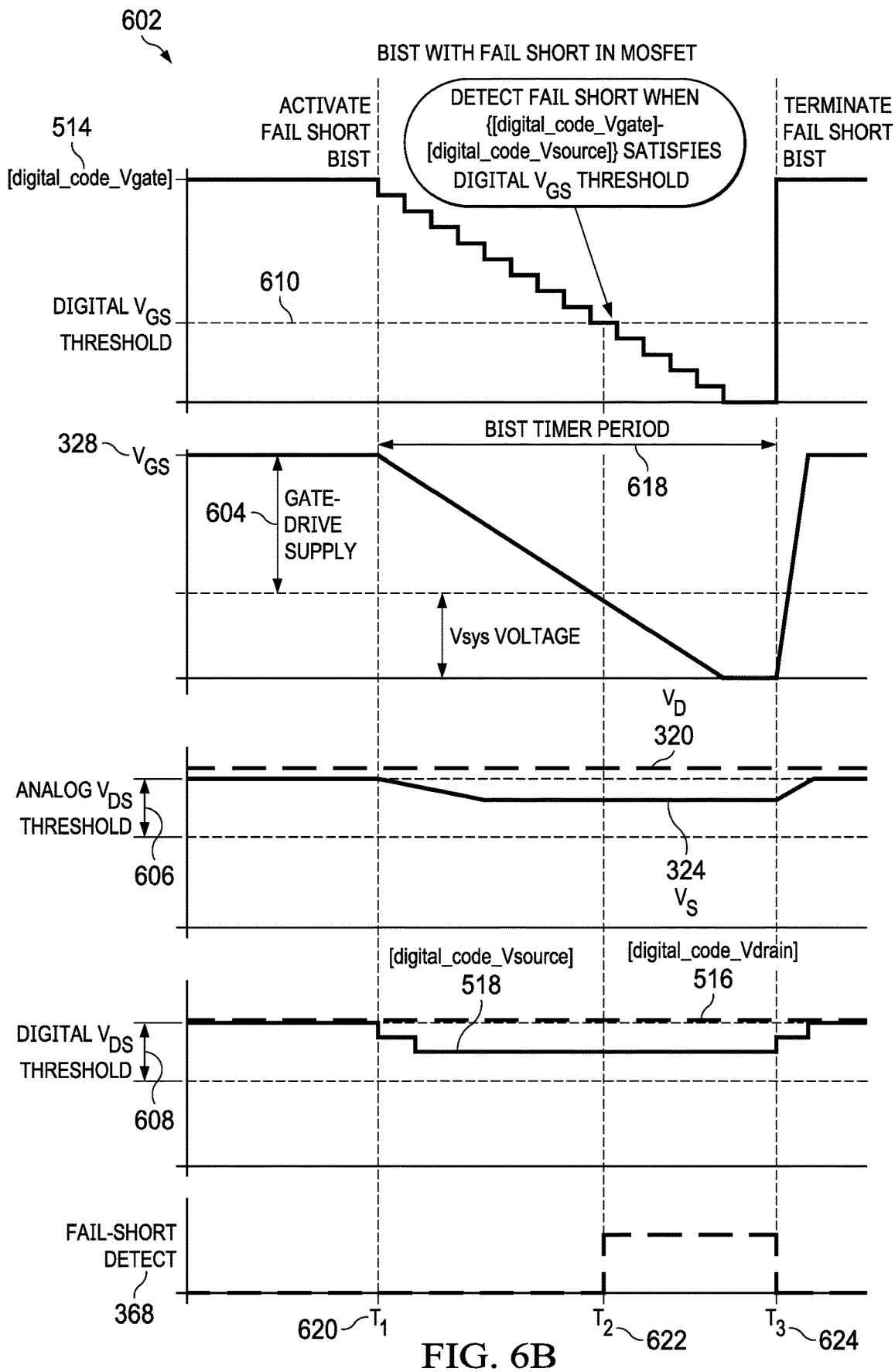
FIG. 6B depicts a fourth example timing diagram corresponding to operation of the second example built-in self-test circuit of FIG. 5.

FIG. 6A depicts a third example timing diagram 600 and FIG. 6B depicts a fourth example timing diagram 602 corresponding to operation of the second BIST circuit 502, and/or, more generally, the second gate-driver circuit 504 of FIG. 5. In FIG. 6A, the third timing diagram 600 corresponds to operation of the second BIST circuit 502 when the MOSFET 304 of FIGS. 3 and 5 does not have a fail short. In FIG. 6B, the fourth timing diagram 602 corresponds to operation of the second BIST circuit 502 when the MOSFET 304 has a fail short. Depicted in the timing diagrams 600, 602 of FIGS. 6A-6B are example waveforms for the first digital signal 514, $V_{GS}$ 328, $V_D$ 320, $V_S$ 324, the second digital signal 516, the third digital signal 518, and the fail-short detection signal 368 of FIG. 5.

In the timing diagrams 600, 602 of FIGS. 6A-6B, the gate-drive supply 344 of FIG. 5 provides support for voltage outputs in a range designated by reference number 604. In the timing diagrams 600, 602 of FIGS. 6A-6B, the $V_{DS}$ threshold in analog representation or format (Analog $V_{DS}$ threshold) is designated by reference number 606 and the $V_{DS}$ threshold in digital representation or format (Digital $V_{DS}$ threshold) is designated by reference number 608. The digital $V_{DS}$ threshold 608 corresponds to a difference between a first digital code as the second digital signal 516 and a second digital code as the third digital signal 518, where the difference between values of the first and second digital codes corresponds to an analog voltage representative of a voltage for $V_{DS}$ 318, which is indicative of typical, normal, and/or otherwise valid operation of the MOSFET 304.

In the timing diagrams 600, 602 of FIGS. 6A-6B, the $V_{GS}$ threshold in digital representation or format (Digital $V_{GS}$ threshold) is designated by reference number 610. The digital $V_{GS}$ threshold 610 corresponds to a difference between a first digital code as the first digital signal 514 and a second digital code as the third digital signal 518, where the difference between values of the first and second digital codes corresponds to an analog voltage representative of a zero crossing of $V_{GS}$ 328, which is indicative of a fail-short failure of the MOSFET 304.

In the third timing diagram 600, at a first example time ($T_1$) 612, the second state machine 506 of FIG. 5 invokes, triggers, and/or otherwise initiates a BIST of the MOSFET 304 by generating a first digital code as the first digital signal 514 to direct the DAC 512 of FIG. 5 to reduce $V_G$ 316 from a first voltage to a second voltage less than the first voltage. By reducing $V_G$ 316 to the second voltage, the DAC 512 causes $V_{GS}$ 328 to reduce in voltage at the first time 612. At the first time 612, the second state machine 506 determines that $V_{DS}$ 318 is approximately zero by determining that $V_D$ 320 and $V_S$ 324 are approximately the same voltage based on the second digital signal 516 and the third digital signal 518 corresponding to approximately the same voltages.

In the third timing diagram 600, at a second example time ($T_2$) 614, the second state machine 506 determines that $V_{DS}$ 318 satisfies the $V_{DS}$ threshold. For example, the second state machine 506 can determine that the difference between digital values associated with the second and third digital signals 516, 518 satisfies the digital $V_{DS}$ threshold 608 (e.g., the digital $V_{DS}$ threshold 608 stored in memory of the second state machine 506) and, thus, indicates that $V_{DS}$ 318 satisfies the analog $V_{DS}$ threshold 606. At the second time, 614, the second state machine 506 can determine that the difference between digital values associated with the first and third digital signals 514, 518 does not satisfy the digital $V_{GS}$ threshold 610 (e.g., the digital $V_{GS}$ threshold 610 stored in memory of the second state machine 506) and, thus, indicates that VGs 328 did not perform a zero crossing.

In the third timing diagram 600, the second state machine 506 reduces (e.g., iteratively reduces) $V_G$ 316 by generating (e.g., iteratively generating) digital codes to ramp down $V_G$ 316 and correspondingly $V_{GS}$ 328. At the second time 614, the second state machine 506 maintains $V_G$ 316 at the same voltage by not generating a digital code as the first digital signal 514 to reduce $V_G$ 316. At the second time 614, $V_{GS}$ 328 is positive and the MOSFET 304 did not perform a zero crossing associated with $V_{GS}$ 328.

In the third timing diagram 600, at a third example time ($T_3$) 616, the second state machine 506 determines that the MOSFET 304 does not have a fail short based on $V_{GS}$ 328 being positive after an example BIST timer period 618 has expired. In the third timing diagram 600, the BIST timer period 618 begins at the first time 612 and terminates at the third time 616. For example, the second state machine 506 can trigger or instantiate the BIST timer period 618 using a counter included in the second state machine 506. At the third time 616, the second state machine 506 terminates the BIST of the MOSFET 304 by generating a digital code as the first digital signal 514 to increase $V_G$ 316 to the first voltage (e.g., the first voltage at the first time 612). In response to the second state machine 506 increasing $V_G$ 316, the values of $V_{GS}$ 328, $V_D$ 320, $V_S$ 324, and $V_{DS}$ 318 return to pre-BIST values.

In the fourth timing diagram 602, at a first example time ($T_1$) 620, the second state machine 506 activates a BIST of the MOSFET 304 by generating a first digital code as the first digital signal 514 to direct the DAC 512 to reduce $V_G$ 316 from a first voltage to a second voltage, where the second voltage is less than the first voltage. By reducing $V_G$ 316 to the second voltage, the DAC 512 causes $V_{GS}$ 328 to reduce in voltage at the first time 620. At the first time 620, the second state machine 506 determines that $V_{DS}$ 318 is approximately zero by determining that $V_D$ 320 and $V_S$ 324 are approximately the same voltage based on the second digital signal 516 and the third digital signal 518 corresponding to approximately the same voltages.

In the fourth timing diagram 602, at a second example time ($T_2$) 622, the second state machine 506 detects a fail short when a difference between digital values associated with the first and third digital signals 514, 518 satisfies the digital $V_{GS}$ threshold 610 and, thus, indicates that $V_{GS}$ 328 has performed a zero crossing by transitioning from a positive voltage to a negative voltage. At the second time 622, the second state machine 506 determines that the difference between digital values associated with the second and third digital signals 516, 518 do not satisfy the digital $V_{DS}$ threshold 608 and, thus, indicate that $V_{DS}$ 318 does not satisfy the analog $V_{DS}$ threshold 606. At the second time 622, the fourth comparator 348 of FIGS. 3 and 5 asserts the fail-short detection signal 368 $V_{GS}$ 328 becomes negative. At the second time 622, the second state machine 506 detects and/or otherwise determines that the MOSFET 304 has a fail-short failure based on the assertion of the fail-short detection signal 368. At the second time 622, the second state machine 506 asserts the alert signal 364 when the fail-short failure of the MOSFET 304 is detected.

In the fourth timing diagram 602, at a third example time ($T_3$) 624, the BIST timer period 618 ends and the second state machine 506 de-asserts the fail-short detection signal 368. When the BIST timer period 618 ends, the second state machine 506 generates a digital code as the first digital signal 514 to return $V_G$ 316 to a pre-BIST level (e.g., the voltage of $V_G$ 316 at the first time 620). At the third time 624, the alert signal 364 remains asserted after the BIST timer period 618 expires.

Figure 7:
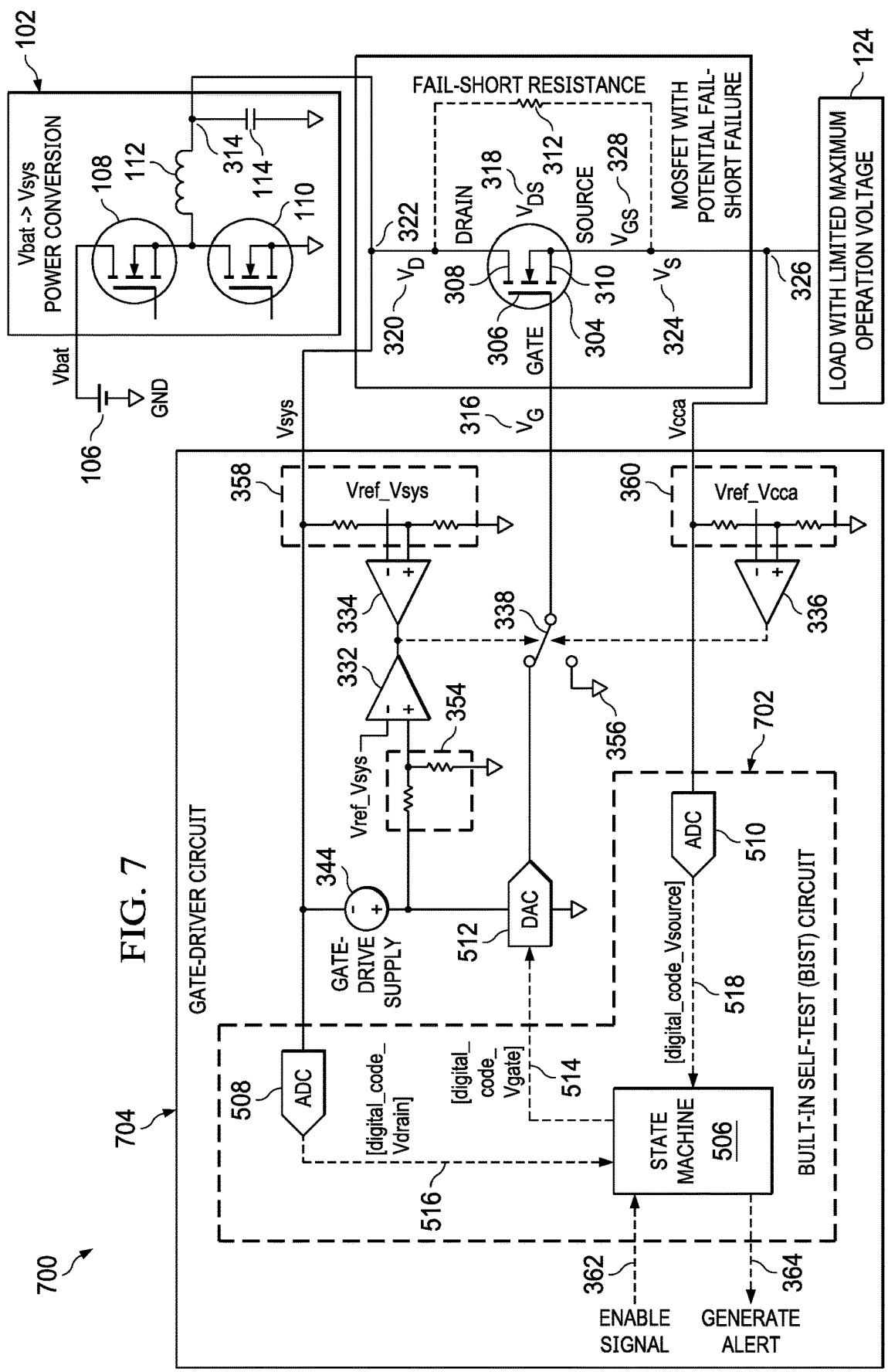
FIG. 7 is a schematic illustration of a third example built-in self-test circuit to detect a fail-short condition associated with the example MOSFET of FIG. 3.

FIG. 7 is a schematic illustration of a fifth example power conversion system 700 including a third example BIST circuit 702 to detect a fail-short condition associated with the MOSFET 304 of FIG. 3. In FIG. 7, a third example gate-driver circuit 704 includes the third BIST circuit 702. In FIG. 7, the third gate-driver circuit 704 is an integrated circuit (e.g., an integrated circuit chip). Alternatively, the third gate-driver circuit 704 may be implemented using hardware logic, machine readable instructions, hardware implemented state machines, and/or any combination thereof.

The fifth power conversion system 700 includes the power source 106 and the first power conversion stage 102 of FIG. 1. Further depicted as coupled to the fifth power conversion system 700 is the load 124 of FIG. 1. Alternatively, the load 124 may not be coupled to the fifth power conversion system 700. The fifth power conversion system 700 includes the MOSFET 304. In some examples, the first power conversion stage 102, the third gate-driver circuit 704, and the MOSFET 304 are included in the same integrated circuit. Alternatively, one or more of the first power conversion stage 102, the third gate-driver circuit 704, and/or the MOSFET 304 may be included in separate integrated circuits.

In the illustrated example of FIG. 7, the third gate-driver circuit 704, and/or, more generally, the fifth power conversion system 700 includes the third BIST circuit 702 to perform a BIST on the MOSFET 304 and the third BIST circuit 702 is to, when activated or enabled, control $V_G$ 316 to regulate $V_{DS}$ 318 to a target $V_{DS}$. In the illustrated example of FIG. 7, the third gate-driver circuit 704 includes the first comparator 332, the second comparator 334, the third comparator 336, the switch 338, the gate-drive supply 344, the first voltage divider 354, the second voltage divider 358, and the third voltage divider 360 of FIG. 3, and the DAC 512 of FIG. 5.

In the illustrated example of FIG. 7, the third gate-driver circuit 704 facilitates switching operations of the MOSFET 304 and, in some examples, to trigger a BIST of the MOSFET 304. For example, the third gate-driver circuit 704 can direct the DAC 512 to increase $V_G$ 316 to turn on the MOSFET 304 by causing $V_{GS}$ 328 to be higher than a turn-on voltage threshold of the MOSFET 304. In other examples, the third gate-driver circuit 704 can instruct the DAC 512 to decrease $V_G$ 316 to turn off the MOSFET 304 by causing $V_{GS}$ 328 to be lower than a turn-off voltage threshold of the MOSFET 304.

In the illustrated example of FIG. 7, the third BIST circuit 702 includes the second state machine 506, the first ADC 508, and the second ADC 510 of FIG. 5. In FIG. 7, an output of the first ADC 508 is coupled to the second state machine 506. In FIG. 7, an input of the first ADC 508 is coupled to a negative terminal of the gate-drive supply 344, the second voltage divider 358, and an output of the first power conversion stage 102 of FIG. 1 at the drain node 322 of FIG. 3. In FIG. 7, the second state machine 506 is coupled to an input of the DAC 512. In FIG. 7, a positive terminal of the gate-drive supply 344 is coupled to a power input of the DAC 512. In FIG. 7, a ground or reference input of the DAC 512 is coupled to the ground rail 356. In FIG. 7, the output of the DAC 512 is coupled to the gate 306 of the MOSFET 304 via the switch 338. In FIG. 7, the input of the second ADC 510 is coupled to the third voltage divider 360 and the third comparator 336 via the third voltage divider 360. In FIG. 7, the input of the second ADC 510 is coupled to the source 310 and the load 124 at the source node 326. In FIG. 7, an output of the ADC 510 is coupled to the second state machine 506.

In some examples, the third BIST circuit 702 is an integrated circuit. For example, the third BIST circuit 702 can be included in a first integrated circuit and the first comparator 332, the second comparator 334, the third comparator 336, the switch 338, the gate-drive supply 344, the first voltage divider 354, the second voltage divider 358, the third voltage divider 360, and/or the DAC 512 are included in a second integrated circuit, where the first and second integrated circuits are included in a third integrated circuit corresponding to the third gate-driver circuit 704 or the fifth power conversion system 700.

In operation, the second state machine 506 triggers, enables, and/or otherwise activates a BIST of the MOSFET 304 in response to an assertion of the enable signal 362 of FIG. 3. In response to the assertion of the enable signal 362, the second state machine 506 generates and transmits a first digital code as the first digital signal 514 to the DAC 512 to reduce $V_G$ 316 to regulate $V_{DS}$ 318 to a target $V_{DS}$. In FIG. 7, the second state machine 506 obtains the second digital signal 516 and the third digital signal 518. The second state machine 506 can determine $V_{DS}$ 318 based on a difference between $V_D$ 320 indicated by the second digital signal 516 and $V_S$ 324 indicated by the third digital signal 518.

In the illustrated example of FIG. 7, the second state machine 506 determines whether $V_{DS}$ 318 satisfies a $V_{DS}$ threshold by determining if a voltage difference indicated by the second and third digital signals 516, 518 satisfies the $V_{DS}$ threshold. If $V_{DS}$ 318 does not satisfy the $V_{DS}$ threshold, the second state machine 506 can generate a second digital code as the first digital signal 514 to cause the DAC 512 to output a reduced voltage for $V_G$ 316. In some examples, the second state machine 506 can generate (e.g., repeatedly generate) new digital codes as the first digital signal 514 to cause the DAC 512 to reduce $V_G$ 316 until at least one of the expiration of the BIST timer, $V_{GS}$ 328 becoming negative and causing a zero crossing to occur, or $V_{DS}$ 318 satisfying the $V_{DS}$ threshold. If reducing $V_G$ 316 causes $V_{GS}$ 328 to become negative, the second state machine 506 can determine that the MOSFET 304 has a fail-short failure. The second state machine 506 can assert the alert signal 364 when the fail-short failure of the MOSFET 304 is detected.

If the second state machine 506 determines that $V_{DS}$ 318 satisfies the $V_{DS}$ threshold, the second state machine 506 can maintain $V_G$ 316 at the current voltage (e.g., by not generating a different digital code as the first digital signal 514). For example, the second state machine 506 can maintain $V_G$ 316 at the current voltage until a BIST timer expires. When the BIST timer expires and $V_{DS}$ 318 satisfies the $V_{DS}$ threshold, the second state machine 506 can determine that the MOSFET 304 does not have a fail short. For example, the second state machine 506 may generate a third digital code as the first digital signal 514 to terminate the BIST by directing the DAC 512 to output a pre-BIST voltage as $V_G$ 316.

While an example manner of implementing the third gate-driver circuit 704 is illustrated in FIG. 7, one or more of the elements, processes, and/or devices illustrated in FIG. 7 may be combined, divided, re-arranged, omitted, eliminated, and/or implemented in any other way. Further, the first comparator 332, the second comparator 334, the third comparator 336, the switch 338, the gate-drive supply 344, the first voltage divider 354, the second voltage divider 358, the third voltage divider 360, the second state machine 506, the first ADC 508, the second ADC 510, the DAC 512, and/or, more generally, the third gate-driver circuit 704 of FIG. 7 may be implemented by hardware, software, firmware, and/or any combination of hardware, software, and/or firmware. Thus, for example, any of the first comparator 332, the second comparator 334, the third comparator 336, the switch 338, the gate-drive supply 344, the first voltage divider 354, the second voltage divider 358, the third voltage divider 360, the second state machine 506, the first ADC 508, the second ADC 510, the DAC 512, and/or, more generally, the third gate-driver circuit 704 could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the first comparator 332, the second comparator 334, the third comparator 336, the switch 338, the gate-drive supply 344, the first voltage divider 354, the second voltage divider 358, the third voltage divider 360, the second state machine 506, the first ADC 508, the second ADC 510, the DAC 512, and/or, more generally, the third gate-driver circuit 704 is/are hereby expressly defined to include a non-transitory computer readable storage device or storage disk such as non-volatile memory, volatile memory, etc., including the software and/or firmware. Further still, the third gate-driver circuit 704 of FIG. 7 may include one or more elements, processes, and/or devices in addition to, or instead of, those illustrated in FIG. 7, and/or may include more than one of any or all of the illustrated elements, processes, and devices.

Figure 8A:
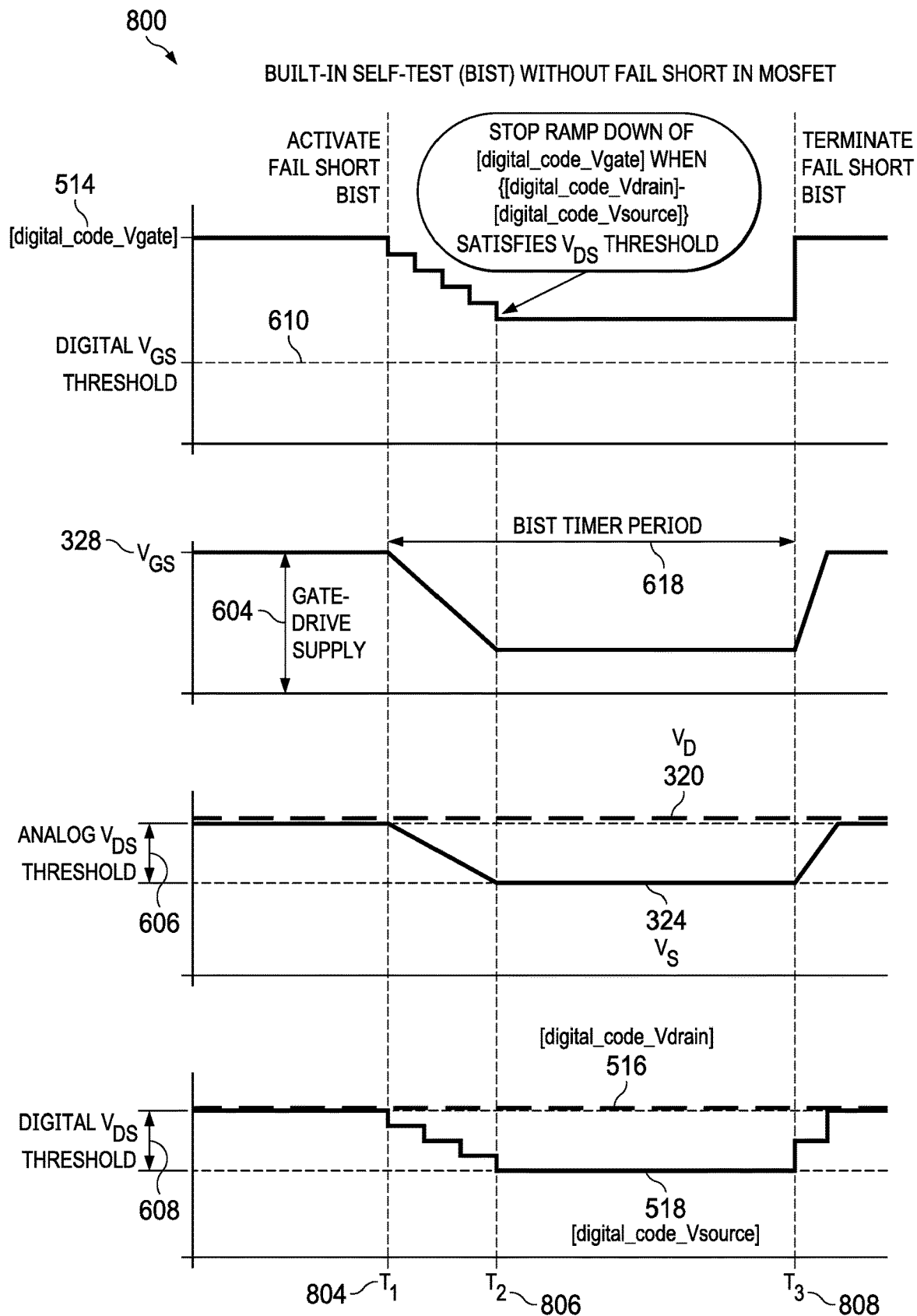
FIG. 8A depicts a fifth example timing diagram corresponding to operation of the third example built-in self-test circuit of FIG. 7.
Figure 8B:
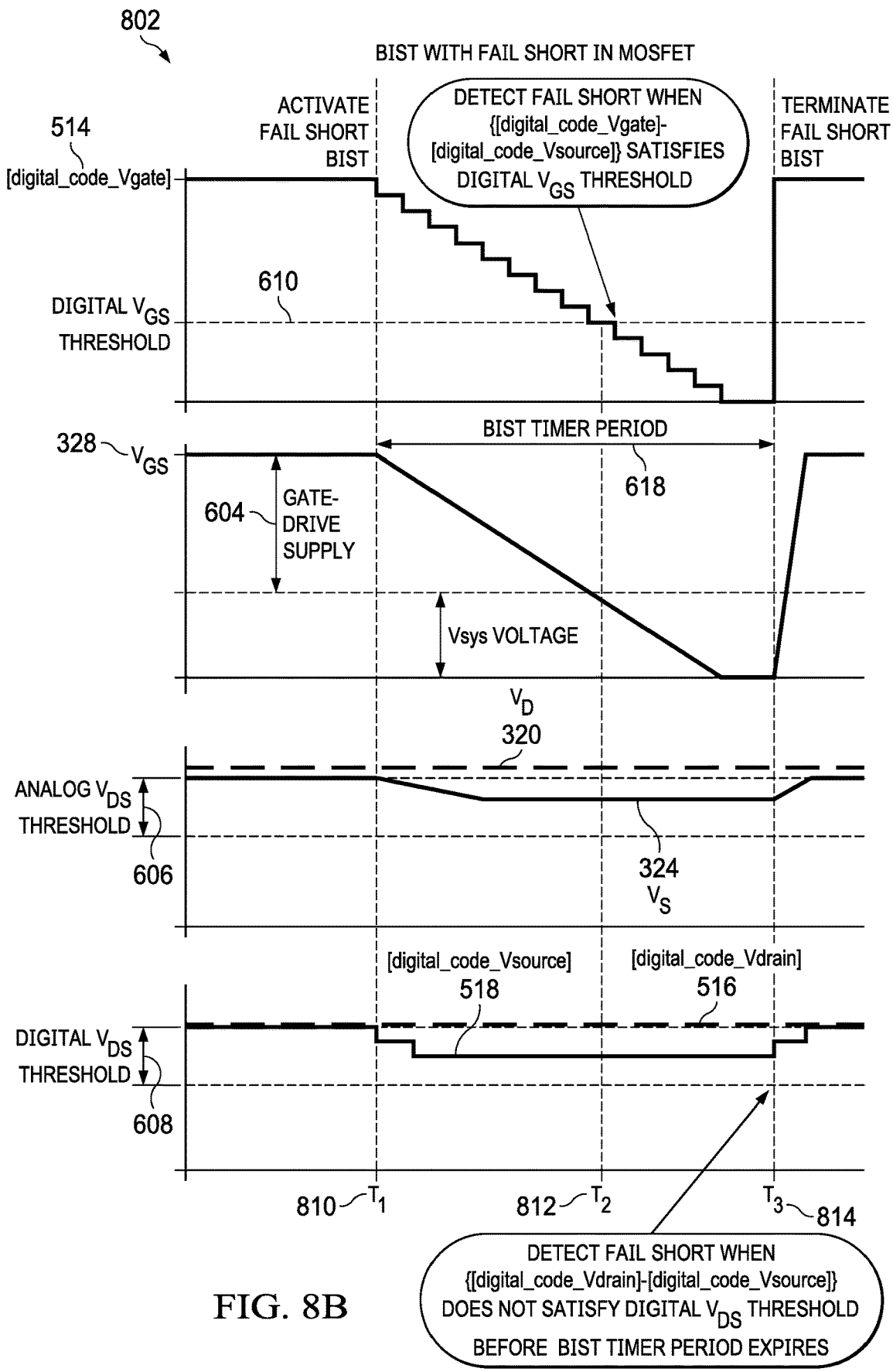
FIG. 8B depicts a sixth example timing diagram corresponding to operation of the third example built-in self-test circuit of FIG. 7.

FIG. 8A depicts a fifth example timing diagram 800 and FIG. 8B depicts a sixth example timing diagram 802 corresponding to operation of the third BIST circuit 702, and/or, more generally, the third gate-driver circuit 704 of FIG. 7. In FIG. 8A, the fifth timing diagram 800 corresponds to operation of the third BIST circuit 702 when the MOSFET 304 of FIGS. 3, 5, and 7 does not have a fail short. In FIG. 8B, the sixth timing diagram 802 corresponds to operation of the third BIST circuit 702 when the MOSFET 304 has a fail short. Depicted in the timing diagrams 800, 802 of FIGS. 8A-8B are example waveforms for the first digital signal 514, $V_{GS}$ 328, $V_D$ 320, $V_S$ 324, the second digital signal 516, and the third digital signal 518 of FIG. 7. In the timing diagrams 800, 802 of FIGS. 8A-8B, the gate-drive supply 344 of FIGS. 3, 5, and 7 provides support for voltage outputs in a range designated by reference number 604. Further depicted in the timing diagrams 800, 802 of FIGS. 8A-8B are the analog $V_{DS}$ threshold 606, the digital $V_{DS}$ threshold 608, and the digital $V_{GS}$ threshold 610.

In the fifth timing diagram 800, at a first example time ($T_1$) 804, the second state machine 506 invokes, triggers, and/or otherwise initiates a BIST of the MOSFET 304 by generating a first digital code as the first digital signal 514 to direct the DAC 512 to reduce $V_G$ 316 from a first voltage to a second voltage less than the first voltage. By reducing $V_G$ 316 to the second voltage, the DAC 512 causes $V_{GS}$ 328 to reduce in voltage at the first time 804. At the first time 804, the second state machine 506 determines that $V_{DS}$ 318 is approximately zero by determining that $V_D$ 320 and $V_S$ 324 are approximately the same voltage based on the second digital signal 516 and the third digital signal 518 corresponding to approximately the same voltages.

In the fifth timing diagram 800, at a second example time ($T_2$) 806, the second state machine 506 determines that $V_{DS}$ 318 satisfies the $V_{DS}$ threshold. For example, the second state machine 506 can determine that the difference between digital values associated with the second and third digital signals 516, 518 satisfies the digital $V_{DS}$ threshold 608 and, thus, indicates that $V_{DS}$ 318 satisfies the analog $V_{DS}$ threshold 606. At the second time 806, the second state machine 506 stops the ramp down of $V_G$ 316 (e.g., by stopping the ramp down of digital codes corresponding to instances of the first digital signal 514) by not generating a subsequent digital code as the first digital signal 514 to reduce $V_G$ 316. At the second time 806, $V_{GS}$ 328 is positive and did not perform a zero crossing.

In the fifth timing diagram 800, at a third example time ($T_3$) 808, the second state machine 506 determines that the MOSFET 304 does not have a fail short based on $V_{GS}$ 328 being positive after the BIST timer period 618 of FIGS. 6A-6B has expired. At the third time 808, the second state machine 506 terminates the BIST of the MOSFET 304 by generating a digital code as the first digital signal 514 to increase $V_G$ 316 to the first voltage (e.g., the voltage at the first time 810). In response to the second state machine 506 increasing $V_G$ 316, the values of $V_{GS}$ 328, $V_D$ 320, $V_S$ 324, and $V_{DS}$ 318 return to pre-BIST values.

In the sixth timing diagram 802, at a first example time ($T_1$) 810, the second state machine 506 activates a BIST of the MOSFET 304 by generating a first digital code as the first digital signal 514 to direct the DAC 512 to reduce $V_G$ 316 from a first voltage to a second voltage, where the second voltage is less than the first voltage. By reducing $V_G$ 316 to the second voltage, the DAC 512 causes $V_{GS}$ 328 to reduce in voltage at the first time 810. At the first time 810, the second state machine 506 determines that $V_{DS}$ 318 is approximately zero by determining that $V_D$ 320 and $V_S$ 324 are approximately the same voltage based on the second digital signal 516 and the third digital signal 518 corresponding to approximately the same voltages.

In the sixth timing diagram 802, at a second example time ($T_2$) 812, the second state machine 506 detects a fail short when a difference between digital values associated with the first and third digital signals 514, 518 satisfies the digital $V_{GS}$ threshold 610 and, thus, indicates that $V_{GS}$ 328 has transitioned from a positive to a negative voltage. For example, the DAC 512 may generate a voltage for $V_G$ 316 based on a first digital code as the first digital signal 514 and the second ADC 510 may provide a second digital code as the third digital signal 518 based on $V_S$ 324, where the difference between the first and second digital codes corresponds to $V_{GS}$ 328. In such examples, when the difference between the first and second digital codes satisfies the digital $V_{GS}$ threshold 610, the second state machine 506 can detect a fail-short failure of the MOSFET 304. At the second time 812, the second state machine 506 can assert the alert signal 364 when the difference between $V_G$ 316 associated with the first digital signal 514 and $V_S$ 324 associated with the third digital signal 518 satisfies the digital $V_{GS}$ threshold 610.

In the sixth timing diagram 802, at a third example time ($T_3$) 814, the second state machine 506 terminates the BIST after the BIST timer period 618 has elapsed by generating a digital code as the first digital signal 514 to return $V_G$ 316 to a pre-BIST level (e.g., the voltage of $V_G$ 316 at the first time 810. Additionally or alternatively, the second state machine 506 may detect the fail-short failure of the MOSFET 304 when the difference between a first digital code of the second digital signal 516 indicative of $V_D$ 320 and a second digital code of the third digital signal 518 indicative of $V_S$ 324 does not satisfy the $V_{DS}$ threshold when the BIST timer period 618 has elapsed at the third time 814. Additionally or alternatively, the second state machine 506 may detect the fail-short failure of the MOSFET 304 when the second digital code of the third digital signal 518 indicative of $V_S$ 324 does not cause $V_{DS}$ 318 to satisfy the $V_{DS}$ threshold when the BIST timer period 618 has elapsed at the third time 822.

Figure 9:
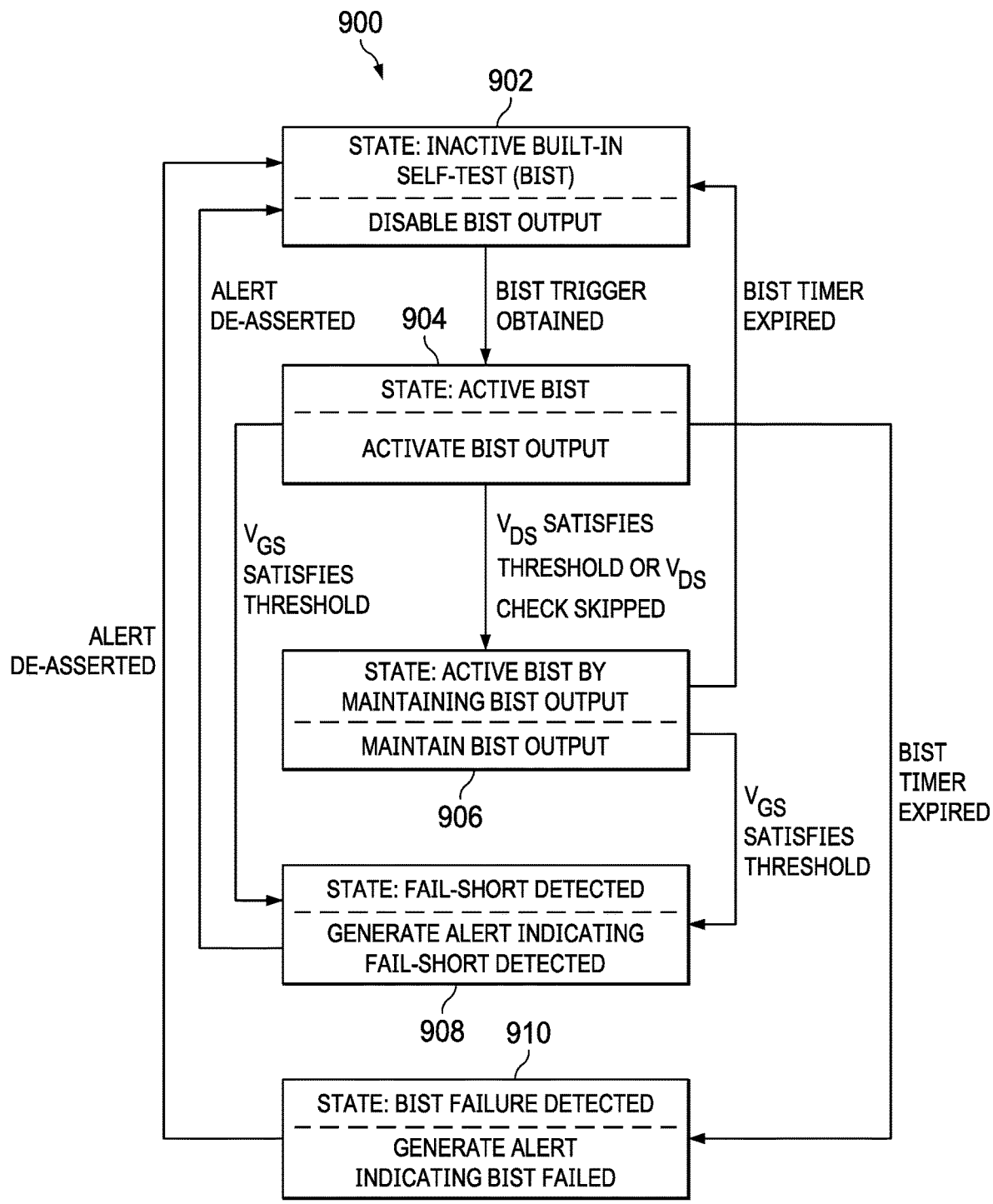
FIG. 9 depicts an example state diagram corresponding to operation of the example BIST state machines of FIGS. 3, 5, and/or 7.
Figure 10:
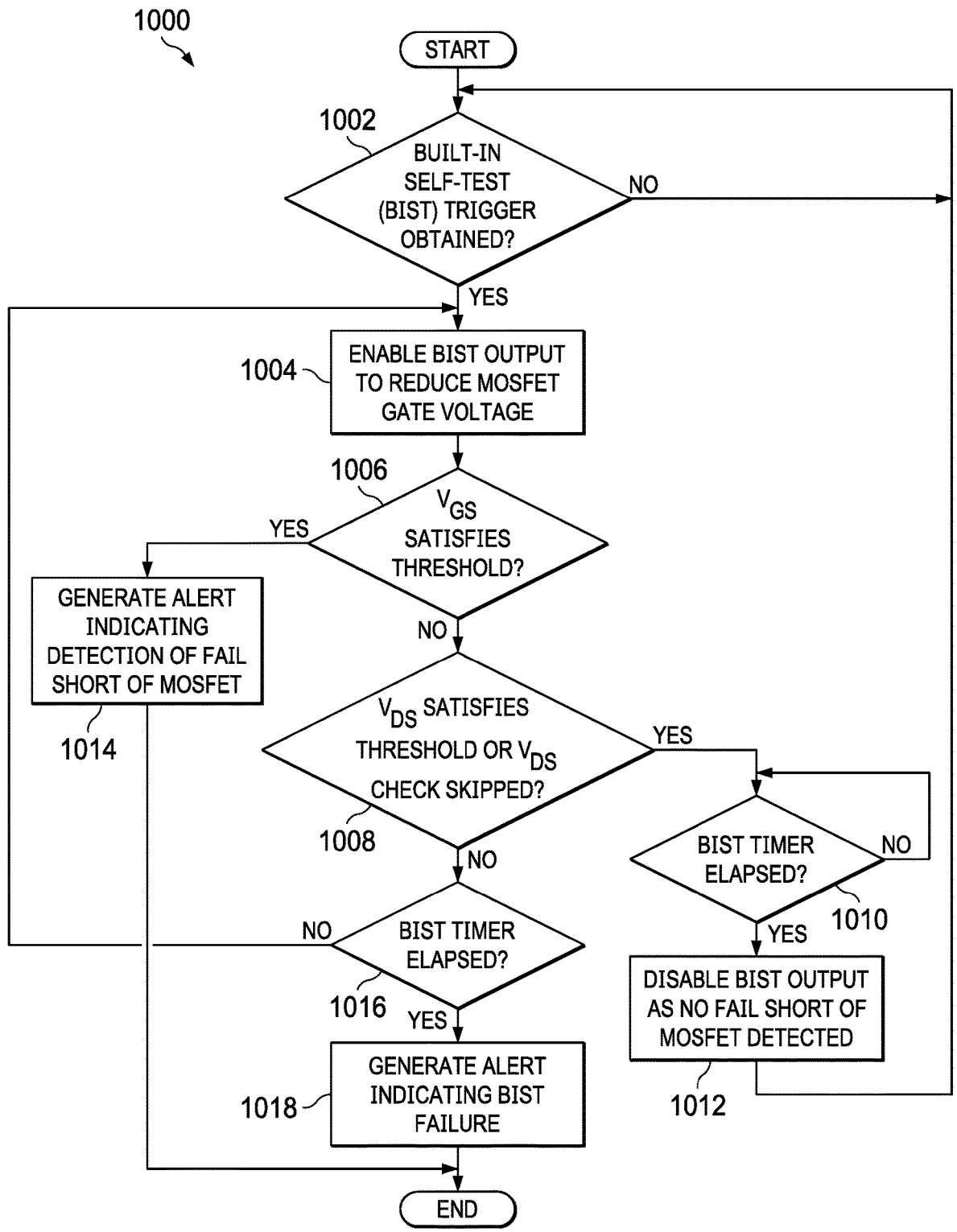
FIG. 10 is a flowchart representative of example machine readable instructions that may be executed to implement the example BIST state machines of FIGS. 3, 5, and/or 7 to detect a fail-short condition associated with the example MOSFET of FIG. 3.

A state diagram representative of example hardware logic, machine readable instructions, hardware implemented state machines, and/or any combination thereof for implementing the first state machine 340 of FIG. 3 and/or the second state machine 506 of FIGS. 5 and 7 is shown in FIG. 9. A flow chart representative of example hardware logic, machine readable instructions, hardware implemented state machines, and/or any combination thereof for implementing the first state machine 340 of FIG. 3 and/or the second state machine 506 of FIGS. 5 and 7 is shown in FIG. 10. The machine readable instructions may be an executable program or portion of an executable program for execution by one or more computer processors, one or more microcontrollers, etc. For example, the machine readable instructions may be executed by one or more integrated circuits, logic circuits, microprocessors, GPUs, DSPs, or controllers from any desired family or manufacturer. For example, the one or more integrated circuits, logic circuits, microprocessors, GPUs, DSPs, or controllers may be semiconductor based (e.g., silicon based) device(s). The program may be embodied in software stored on a non-transitory computer readable storage medium such as non-volatile memory, volatile memory, etc., associated with the one or more computer processors, the one or more microcontrollers, etc., but the entire program and/or parts thereof could alternatively be executed by a device other than the one or more computer processors, the one or more microcontrollers, etc., and/or embodied in firmware or dedicated hardware. Further, although the example program is described with reference to the state diagram illustrated in FIG. 9 and/or the flowchart illustrated in FIG. 10, many other methods of implementing the first state machine 340 of FIG. 3 and/or the second state machine 506 of FIGS. 5 and 7 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 9-10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 9 depicts an example state diagram 900 corresponding to operation of the first state machine 340 of FIG. 3 and/or the second state machine 506 of FIGS. 5 and 7. At a first example state 902, the first state machine 340 and/or the second state machine 506 are in an inactive BIST state. For example, the first state machine 340 may disable a BIST output corresponding to the control signal 366 of FIG. 3 in the first state 902. In such examples, the first state machine 340 can disable the BIST output by not generating the control signal 366 when in the first state 902.

In the illustrated example of FIG. 9, the first state machine 340 and/or the second state machine 506 moves and/or otherwise transitions from the first state 902 to a second example state 904 when a BIST trigger is obtained. For example, the first state machine 340 may transition to the second state 904 when the BIST trigger corresponding to the enable signal 362 of FIG. 3 is asserted. At the second state 904, the first state machine 340 and/or the second state machine 506 are in an active BIST state. For example, the first state machine 340 may generate the control signal 366 to invoke a BIST of the MOSFET 304. In other examples, the second state machine 506 can generate a digital code as the first digital signal 514 of FIG. 5 to invoke the BIST of the MOSFET 304.

In the illustrated example of FIG. 9, the first state machine 340 and/or the second state machine 506 transitions from the second state 904 to a third example state 906 when $V_{DS}$ 318 of FIG. 3 satisfies a threshold (e.g., a $V_{DS}$ threshold corresponding to a voltage of the target $V_{DS}$ 319) or a check of $V_{DS}$ 318 is skipped. For example, the first state machine 340 may move from the second state 904 to the third state 906 because a measurement of $V_{DS}$ 318 is not performed and, thus, the first state machine 340 skips the check for whether $V_{DS}$ 318 satisfies the $V_{DS}$ threshold. In other examples, the second state machine 506 can move from the second state 904 to the third state 906 when the second state machine 506 determines that $V_{DS}$ 318 satisfies the $V_{DS}$ threshold (e.g., the analog $V_{DS}$ threshold 606, the digital $V_{DS}$ threshold 608, etc.) associated with the BIST based on a difference between the second and third digital signals 516, 518 of FIG. 5.

When in the third state 906, the first state machine 340 and/or the second state machine 506 maintain a BIST output. For example, the first state machine 340 may maintain the BIST output corresponding to the control signal 366 by causing $V_G$ 316 to be maintained at the same voltage by maintaining the control signal 366 at a current signal level. In other examples, the second state machine 506 can maintain the BIST output corresponding to the first digital signal 514 by not generating a different digital code for the first digital signal 514 (e.g., maintain the digital code currently being used). The first state machine 340 and/or the second state machine 506 can move from the third state 906 to the first state 902 when a BIST timer has expired. For example, the first state machine 340 may move from the third state 906 to the first state 902 when $V_{DS}$ 318 corresponds to the target $V_{DS}$ 319 and the BIST timer period 409 of FIGS. 4A-4B has elapsed. In such examples, the first state machine 340 can determine that the MOSFET 304 does not have a fail short and, thus, terminate the BIST by disabling the control signal 366.

In the illustrated example of FIG. 9, the first state machine 340 and/or the second state machine 506 moves from the third state 906 to a fourth example state 908 when $V_{GS}$ 328 satisfies a threshold. For example, the first state machine 340 and/or the second state machine 506 may move from the third state 906 to the fourth state 908 when the fourth comparator 348 asserts the fail-short detection signal 368. In other examples, the second state machine 506 can move from the third state 906 to the fourth state 908 when the second state machine 506 determines that a difference between respective digital codes of the first and third digital signals 514, 518 satisfies the digital $V_{GS}$ threshold 610 of FIGS. 6A-6B and 8A-8B and, thus, indicates that a zero crossing of $V_{GS}$ 328 has occurred. At the fourth state 908, the first state machine 340 and/or the second state machine 506 assert the alert signal 364 indicative of detecting a fail-short failure of the MOSFET 304. In FIG. 9, the first state machine 340 and/or the second state machine 506 move from the fourth state 908 to the first state 902 when the alert signal 364 is de-asserted.

In the illustrated example of FIG. 9, the first state machine 340 and/or the second state machine 506 move from the second state 904 to the fourth state 908 when $V_{GS}$ 328 satisfies a threshold. For example, the first state machine 340 and/or the second state machine 506 can detect a fail-short condition of the MOSFET 304 when the fourth comparator 348 asserts the fail-short detection signal 368 based on a zero crossing of $V_{GS}$ 328. In other examples, the second state machine 506 can detect a fail-short condition of the MOSFET 304 when a digital code associated with the first digital signal 514 corresponds to a value of $V_G$ 316 that causes $V_{GS}$ 328 to become negative.

In the illustrated example of FIG. 9, the first state machine 340 and/or the second state machine 506 move from the second state 904 to a fifth example state 910 when the BIST timer has expired. At the fifth state 910, the first state machine 340 and/or the second state machine 506 are in a BIST failure detected state. For example, if neither $V_{GS}$ 328 satisfies the $V_{GS}$ threshold nor $V_{DS}$ 318 satisfies the $V_{DS}$ threshold when the BIST timer has expired, the first state machine 340 and/or the second state machine 506 can detect a failure associated with the BIST circuits 302, 502, 702 of FIGS. 3, 5, and/or 7. In such examples, if the BIST circuits 302, 502, 702 are unable to raise $V_{DS}$ 318, reduce $V_{GS}$ 328, etc., the BIST timer period 409 of FIGS. 4A-4B, the BIST timer period 618 of FIGS. 6A-6B and 8A-8B, etc., expires before the satisfying of the $V_{GS}$ threshold, the $V_{DS}$ threshold, etc. For example, the first state machine 340 and/or the second state machine 506 may detect that one or more components of the BIST circuits 302, 502, 702 and/or the gate-driver circuits 303, 504, 704 have failed when at the fifth state 910.

At the fifth state 910, the first state machine 340 and/or the second state machine 506 generates an alert indicating that the BIST has failed. For example, the first state machine 340 and/or the second state machine 506 can assert the alert signal 364 when in the fifth state 910. Alternatively, the first state machine 340 and/or the second state machine 506 can assert a separate alert signal (e.g., a BIST fail alert signal) from the alert signal 364 when in the fifth state 910. In FIG. 9, the first state machine 340 and/or the second state machine 506 move from the fifth state 910 to the first state 902 when the alert signal 364 is de-asserted.

FIG. 10 is a flowchart representative of example machine readable instructions 1000 which may be executed to implement the first state machine 340 of FIG. 3 and/or the second state machine 506 of FIGS. 5 and 7 to detect a fail-short condition associated with the MOSFET 304 of FIG. 3. The machine readable instructions 1000 begin at block 1002, at which the first state machine 340 and/or the second state machine 506 determine whether a BIST trigger is obtained. For example, the first state machine 340 may determine that the enable signal 362 of FIG. 3 is asserted. In other examples, the second state machine 506 can obtain an assertion of the enable signal 362.

If, at block 1002, the first state machine 340 and/or the second state machine 506 determine that the BIST trigger is not obtained, control waits at block 1002. If at block 1002, the first state machine 340 and/or the second state machine 506 determine that the BIST trigger is obtained, then, at block 1004, the first state machine 340 and/or the second state machine 506 enable a BIST output to reduce a MOSFET gate voltage. For example, the first state machine 340 may generate the control signal 366 of FIG. 3 to trigger a BIST of the MOSFET 304 when the enable signal 362 is asserted. In such examples, the first state machine 340 can cause the variable voltage source 342 to direct the amplifier 346 to reduce $V_G$ 316 of the MOSFET 304. In other examples, the second state machine 506 can generate the first digital signal 514 of FIG. 5 to reduce $V_G$ 316 of the MOSFET 304.

At block 1006, the first state machine 340 and/or the second state machine 506 determine whether $V_{GS}$ satisfies a threshold. For example, the first state machine 340 may determine that $V_{GS}$ 328 satisfies a $V_{GS}$ threshold when $V_{GS}$ 328 become a negative voltage based on an assertion of the fail-short detection signal 368 from the fourth comparator 348. In other examples, the second state machine 506 can determine that $V_{GS}$ 328 satisfies the $V_{GS}$ threshold when $V_{GS}$ 328 becomes a negative voltage based on an assertion of the fail-short detection signal 368 from the fourth comparator 348. Alternatively, the second state machine 506 can determine that $V_{GS}$ 328 satisfies the $V_{GS}$ threshold based on $V_{DS}$ 318 satisfying a $V_{DS}$ threshold based on a value of $V_D$ 320 indicated by the second digital signal 516 and a value of $V_S$ 324 indicated by the third digital signal 518.

If, at block 1006, the first state machine 340 and/or the second state machine 506 determine that $V_{GS}$ satisfies the threshold, control proceeds to block 1014 to generate an alert indicating detection of a fail-short failure of the MOSFET. For example, the first state machine 340 and/or the second state machine 506 may assert the alert signal 364 when the fail-short detection signal 368 is asserted. In response to generating the alert indicating detection of the fail-short failure of the MOSFET at block 1014, the machine readable instructions 1000 of FIG. 10 conclude.

If, at block 1006, the first state machine 340 and/or the second state machine 506 determine that $V_{GS}$ does not satisfy the threshold, then, at block 1008, the first state machine 340 and/or the second state machine 506 determine whether $V_{DS}$ satisfies a threshold or a $V_{DS}$ check has been skipped. For example, the first state machine 340 may skip the check for whether $V_{DS}$ 318 satisfies the $V_{DS}$ threshold. In other examples, the second state machine 506 can determine that $V_{DS}$ 318 has reached the target $V_{DS}$ 319 when a difference between a value of $V_D$ 320 indicated by the second digital signal 516 and a value of $V_S$ 324 indicated by the third digital signal 518 corresponds to the target $V_{DS}$ 319.

If, at block 1008, the first state machine 340 and/or the second state machine 506 determine that $V_{DS}$ satisfies the threshold, then, at block 1010, the first state machine 340 and/or the second state machine 506 determine whether the BIST timer has elapsed. For example, the first state machine 340 may determine that the BIST timer period 409 of FIGS.

4A-4B has elapsed. In other examples, the second state machine 506 can determine that the BIST timer period 618 of FIGS. 6A-6B has expired.

If, at block 1010, the first state machine 340 and/or the second state machine 506 determine that the BIST timer has not elapsed, control waits at block 1010. If, at block 1010, the first state machine 340 and/or the second state machine 506 determine that the BIST timer has elapsed, then, at block 1012, the first state machine 340 and/or the second state machine 506 disable the BIST output as no fail short of the MOSFET is detected. For example, the first state machine 340 may not detect a fail-short failure of the MOSFET 304 when the fail-short detection signal 368 is not asserted when the BIST timer period 409 of FIGS. 4A-4B has expired. In such examples, the first state machine 340 can disable the control signal 366 to terminate the BIST when a fail short is not detected. In other examples, the second state machine 506 can generate a digital code as the first digital signal 514 to terminate the BIST when the fail-short detection signal 368 is not asserted when the BIST timer period 618 of FIGS. 6A-6B has expired. In yet other examples, the second state machine 506 can generate a digital code as the first digital signal 514 to terminate the BIST when a difference between $V_D$ 320 and $V_S$ 324 satisfies the $V_{DS}$ threshold after the BIST timer period 618 has elapsed. In response to disabling the BIST output at block 1012, control returns to block 1002 to determine whether the BIST trigger is obtained to trigger another BIST of the MOSFET 304.

If, at block 1008, the first state machine 340 and/or the second state machine 506 determine that $V_{DS}$ 318 does not satisfy the threshold or the $V_{DS}$ check has been skipped, control proceeds to block 1016 to determine whether the BIST timer has elapsed. If, at block 1016, the first state machine 340 and/or the second state machine 506 determine that the BIST timer has not elapsed, control returns to block 1004 to enable the BIST output to reduce the MOSFET gate voltage. For example, the second state machine 506 may generate a different digital code as the first digital signal 514 to reduce $V_G$ 316 from a first voltage to a second voltage less than the first voltage.

If, at block 1016, the first state machine 340 and/or the second state machine 506 determine that the BIST timer has expired, then, at block 1018, the first state machine 340 and/or the second state machine 506 generate an alert indicating BIST failure. For example, the first state machine 340 can assert the alert signal 364 indicating that the BIST has failed. In other examples, the second state machine 506 can assert the alert signal 364 indicating that one or more components of the BIST circuit 502, 702 and/or the gate-driver circuits 504, 704 of FIGS. 5 and/or 7 are unable to increase $V_{DS}$ 318, decrease $V_{GS}$ 328, etc. Alternatively, the first state machine 340 and/or the second state machine 506 can assert a separate alert signal (e.g., a BIST fail alert signal) from the alert signal 364. For example, the BIST fail alert signal can indicate that the BIST has failed or indicate that one or more components of the BIST circuit 502, 702 and/or the gate-driver circuits 504, 704 of FIGS. 5 and/or 7 are unable to increase $V_{DS}$ 318, decrease $V_{GS}$ 328, etc. In response to generating the alert indicating BIST failure, the machine readable instructions 1000 of FIG. 10 conclude.

From the foregoing, it will be appreciated that example systems, methods, apparatus, and articles of manufacture have been disclosed that facilitate a BIST to detect a fail-short failure associated with a power switching device. Disclosed systems, methods, apparatus, and articles of manufacture control a gate voltage of the power switching device to regulate a drain-to-source voltage of the power switching device to a target drain-to-source voltage. Advantageously, the target drain-to-source voltage corresponds to a voltage level that ensures relevant parts of the power conversion system have a sufficient supply voltage while enabling detectability of a potential fail-short failure. Disclosed systems, methods, apparatus, and articles of manufacture detect a fail-short failure of the power switching device when a gate-to-source voltage of the power switching device goes below zero volts indicative of a zero crossing. Disclosed systems, methods, apparatus, and articles of manufacture allows the usage of one power switching device and one power conversion device to create a supply voltage that stays below a maximum operating voltage of a load having a limited maximum operation voltage for up to two faults in the power conversion system.

Example BIST circuits and related methods are disclosed herein. Further examples and combinations thereof include the following:

Example 1 includes a built-in self-test (BIST) circuit, comprising a state machine to generate a control signal to reduce a gate voltage associated with a transistor from a first voltage to a second voltage when an enable signal is asserted, the transistor to be enabled at the first voltage and the second voltage, and assert an alert signal when a gate-to-source voltage associated with the transistor satisfies a threshold when the gate voltage is reduced to the second voltage.

Example 2 includes the BIST circuit of example 1, further including a variable voltage supply coupled to the state machine, and wherein the BIST circuit is included in a gate-driver circuit, the gate-driver circuit to be coupled to the transistor, and the gate-driver circuit includes an amplifier coupled to the variable voltage supply and a gate of the transistor, the amplifier is to reduce the gate voltage to the second voltage when the state machine is to reduce a third voltage at an input of the amplifier by adjusting a fourth voltage associated with the variable voltage supply.

Example 3 includes the BIST circuit of example 1, further including a comparator, an output of the comparator coupled to the state machine, a first input of the comparator to measure the gate voltage, a second input of the comparator to measure a source voltage associated with the transistor, and the comparator is to assert a detection signal when the gate-to-source voltage satisfies the threshold.

Example 4 includes the BIST circuit of example 1, wherein the state machine is to de-assert the control signal to increase the gate voltage to the first voltage when the gate-to-source voltage does not satisfy the threshold after a BIST timer period has expired.

Example 5 includes the BIST circuit of example 1, wherein the threshold is a first voltage, and the BIST circuit is included in a gate-driver circuit, the gate-driver circuit to be coupled to the transistor, and the gate-driver circuit includes a switch to be coupled to a gate of the transistor, the switch to couple the gate to a ground rail when switched from a first state to a second state, a gate-drive supply to be coupled to the transistor, a first comparator to switch the switch to the second state when a third voltage associated with the gate-drive supply satisfies a second threshold, a second comparator to switch the switch to the second state when a drain voltage associated with the transistor satisfies a third threshold, and a third comparator to switch the switch to the second state when a source voltage associated with the transistor satisfies a fourth threshold.

Example 6 includes the BIST circuit of example 1, wherein the control signal is a first digital signal, and further including a first analog-to-digital converter (ADC) to measure a drain voltage associated with the transistor by converting the drain voltage to a second digital signal, and a second ADC to measure a source voltage associated with the transistor by converting the source voltage to a third digital signal.

Example 7 includes the BIST circuit of example 6, wherein the control signal is a first control signal, the threshold is a first threshold, and the state machine is to determine a drain-to-source voltage associated with the transistor based on a difference between the second digital signal and the third digital signal, determine that the transistor does not have a fail-short condition when the difference satisfies a second threshold, and generate a second control signal to increase the gate voltage to the first voltage.

Example 8 includes the BIST circuit of example 6, wherein the threshold is a first threshold, and the state machine is to determine a drain-to-source voltage associated with the transistor based on a difference between the second digital signal and the third digital signal, detect a fail-short condition associated with the transistor when the difference does not satisfy a second threshold and a BIST timer period has expired, and assert the alert signal when the fail-short condition is detected.

Example 9 includes a power conversion system, comprising a power conversion stage, a transistor coupled to the power conversion stage, and a built-in self-test (BIST) circuit, the BIST circuit including a state machine, the state machine is to generate a control signal to reduce a gate voltage associated with the transistor from a first voltage to a second voltage when an enable signal is asserted, the transistor to be enabled at the first voltage and the second voltage, and assert an alert signal when a gate-to-source voltage associated with the transistor satisfies a threshold when the gate voltage is reduced to the second voltage.

Example 10 includes the power conversion system of example 9, wherein the BIST circuit includes a variable voltage supply coupled to the state machine, and further including an amplifier coupled to the variable voltage supply and a gate of the transistor, the amplifier is to reduce the gate voltage to the second voltage when the state machine is to reduce a third voltage at an input of the amplifier by adjusting a fourth voltage associated with the variable voltage supply.

Example 11 includes the power conversion system of example 9, further including a comparator, an output of the comparator coupled to the state machine, a first input of the comparator to measure the gate voltage, a second input of the comparator to measure a source voltage associated with the transistor, and the comparator is to assert a detection signal when the gate-to-source voltage satisfies the threshold.

Example 12 includes the power conversion system of example 9, wherein the state machine is to de-assert the control signal to increase the gate voltage to the first voltage when the gate-to-source voltage does not satisfy the threshold after a BIST timer period has expired.

Example 13 includes the power conversion system of example 9, wherein the threshold is a first voltage, and further including a gate-driver circuit, the gate-driver circuit including a switch to be coupled to a gate of the transistor, the switch to couple the gate to a ground rail when switched from a first state to a second state, the transistor to turn off when the gate is coupled to the ground rail, a load to be disconnected from the power conversion stage when the transistor is turned off, a gate-drive supply to be coupled to the transistor, a first comparator to switch the switch to the second state when a third voltage associated with the gate-drive supply satisfies a second threshold, a second comparator to switch the switch to the second state when a drain voltage associated with the transistor satisfies a third threshold, and a third comparator to switch the switch to the second state when a source voltage associated with the transistor satisfies a fourth threshold.

Example 14 includes the power conversion system of example 9, wherein the control signal is a first digital signal, and the BIST circuit further includes a first analog-to-digital converter (ADC) to measure a drain voltage associated with the transistor by converting the drain voltage to a second digital signal, and a second ADC to measure a source voltage associated with the transistor by converting the source voltage to a third digital signal.

Example 15 includes the power conversion system of example 14, wherein the control signal is a first control signal, the threshold is a first threshold, and the state machine is to determine a drain-to-source voltage associated with the transistor based on a difference between the second digital signal and the third digital signal, determine that the transistor does not have a fail-short condition when the difference satisfies a second threshold, and generate a second control signal to increase the gate voltage to the first voltage.

Example 16 includes the power conversion system of example 14, wherein the threshold is a first threshold, and the state machine is to determine a drain-to-source voltage associated with the transistor based on a difference between the second digital signal and the third digital signal, detect a fail-short condition associated with the transistor when the difference does not satisfy a second threshold and a BIST timer period has expired, and assert the alert signal when the fail-short condition is detected.

Example 17 includes a gate-driver circuit, comprising a state machine, a variable voltage supply, the variable voltage supply coupled to the state machine, a first terminal of the variable voltage supply to be coupled to a first current terminal of a transistor, an amplifier, a first input of the amplifier coupled to a second terminal of the variable voltage supply, an output of the amplifier to be coupled to a gate of the transistor, a second input of the amplifier to be coupled to a second current terminal of the transistor, and a comparator, an output of the comparator coupled to the state machine, a first input of the comparator coupled to the output of the amplifier, the first input of the comparator to be coupled to the gate of the transistor, a second input of the comparator to be coupled to the second current terminal of the transistor.

Example 18 includes the gate-driver circuit of example 17, further including a gate-drive supply, a first terminal of the gate-drive supply coupled to the first terminal of the variable voltage supply, the first terminal of the gate-drive supply to be coupled to the first current terminal of the transistor, and a second terminal of the gate-drive supply coupled to a third input of the amplifier.

Example 19 includes the gate-driver circuit of example 17, wherein the output of the amplifier is coupled to a switch, the switch to be coupled to the gate of the transistor.

Example 20 includes the gate-driver circuit of example 17, wherein the second input of the amplifier is to be coupled to a load, the load being at least one of one or more processors, non-volatile memory, or volatile memory associated with a vehicle.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A built-in self-test (BIST) circuit, comprising:
a state machine having an enable input, having an alert output, having a gate voltage control output adapted to be coupled to a gate of a power transistor, and having a source voltage input adapted to be coupled to the source of the power transistor, the state machine having states to:
generate a gate control signal on the gate voltage control output to reduce a gate voltage associated with the power transistor from a first voltage to a second voltage when an enable signal is asserted on the enable input, the power transistor to be enabled at the first voltage and the second voltage; and
assert an alert signal on the alert output when a gate-to-source voltage associated with the power transistor satisfies a threshold when the gate voltage is reduced to the second voltage.

2. The BIST circuit of claim 1, including a variable voltage supply coupled to the gate voltage control output, and the BIST circuit is included in a gate-driver circuit, the gate-driver circuit to be coupled to the power transistor, and the gate-driver circuit includes:
an amplifier coupled to the variable voltage supply and the gate of the power transistor, the amplifier is to reduce the gate voltage to the second voltage.

3. The BIST circuit of claim 1, including a comparator, an output of the comparator coupled to the source voltage input, a first input of the comparator to measure the gate voltage, a second input of the comparator to measure a source voltage associated with the power transistor, and the comparator is to assert a detection signal when the gate-to-source voltage satisfies the threshold.

4. The BIST circuit of claim 1, in which the state machine is to de-assert the gate control signal to increase the gate voltage to the first voltage when the gate-to-source voltage does not satisfy the threshold after a BIST timer period has expired.

5. The BIST circuit of claim 1, in which the threshold is a first voltage, and the BIST circuit is included in a gate-driver circuit, the gate-driver circuit to be coupled to the power transistor, and the gate-driver circuit includes:
a switch to be coupled to the gate of the power transistor, the switch to couple the gate to a ground rail when switched from a first state to a second state;
a gate-drive supply to be coupled to the power transistor;
a first comparator to switch the switch to the second state when a third voltage associated with the gate-drive supply satisfies a second threshold;
a second comparator to switch the switch to the second state when a drain voltage associated with the power transistor satisfies a third threshold; and
a third comparator to switch the switch to the second state when a source voltage associated with the power transistor satisfies a fourth threshold.

6. The BIST circuit of claim 1, in which the gate control signal is a first digital signal, and further including:
a first analog-to-digital converter (ADC) to measure a drain voltage associated with the power transistor by converting the drain voltage to a second digital signal; and
a second ADC to measure a source voltage associated with the power transistor by converting the source voltage to a third digital signal.

7. The BIST circuit of claim 6, in which the gate control signal is a first control signal, the threshold is a first threshold, and the state machine is to:
determine a drain-to-source voltage associated with the power transistor based on a difference between the second digital signal and the third digital signal;
determine that the power transistor does not have a fail-short condition when the difference satisfies a second threshold; and
generate a second control signal to increase the gate voltage to the first voltage.

8. The BIST circuit of claim 6, in which the threshold is a first threshold, and the state machine is to:
determine a drain-to-source voltage associated with the power transistor based on a difference between the second digital signal and the third digital signal;
detect a fail-short condition associated with the power transistor when the difference does not satisfy a second threshold and a BIST timer period has expired; and
assert the alert signal when the fail-short condition is detected.

9. A power conversion system, comprising:
a power conversion stage;
a power transistor having a drain, a gate, and a source and being coupled to the power conversion stage; and
a built-in self-test (BIST) circuit, the BIST circuit including a state machine having an enable input, having an alert output, having a gate voltage control output coupled to the gate of the power transistor, and having a source voltage input coupled to the source of the power transistor, the state machine having states to:
generate a gate control signal to reduce a gate voltage associated with the power transistor from a first voltage to a second voltage when an enable signal on the enable input is asserted, the power transistor to be enabled at the first voltage and the second voltage; and
assert an alert signal on the alert output when a gate-to-source voltage associated with the power transistor satisfies a threshold when the gate voltage is reduced to the second voltage.

10. The power conversion system of claim 9, in which the BIST circuit includes a variable voltage supply coupled to the gate voltage control output, and including:
an amplifier coupled to the variable voltage supply and a gate of the power transistor, the amplifier is to reduce the gate voltage to the second voltage.

11. The power conversion system of claim 9, including a comparator, an output of the comparator coupled to the source voltage input, a first input of the comparator to measure the gate voltage, a second input of the comparator to measure a source voltage associated with the power transistor, and the comparator is to assert a detection signal when the gate-to-source voltage satisfies the threshold.

12. The power conversion system of claim 9, in which the state machine is to de-assert the gate control signal to increase the gate voltage to the first voltage when the gate-to-source voltage does not satisfy the threshold after a BIST timer period has expired.

13. The power conversion system of claim 9, in which the threshold is a first voltage, and further including a gate-driver circuit, the gate-driver circuit including:
a switch to be coupled to the gate of the power transistor, the switch to couple the gate to a ground rail when switched from a first state to a second state, the power transistor to turn off when the gate is coupled to the ground rail, a load to be disconnected from the power conversion stage when the power transistor is turned off;

a gate-drive supply to be coupled to the power transistor;

a first comparator to switch the switch to the second state when a third voltage associated with the gate-drive supply satisfies a second threshold;

a second comparator to switch the switch to the second state when a drain voltage associated with the power transistor satisfies a third threshold; and a third comparator to switch the switch to the second state when a source voltage associated with the power transistor satisfies a fourth threshold.

14. The power conversion system of claim 9, in which the gate control signal is a first digital signal, and the BIST circuit includes:

a first analog-to-digital converter (ADC) to measure a drain voltage associated with the power transistor by converting the drain voltage to a second digital signal; and a second ADC to measure a source voltage associated with the power transistor by converting the source voltage to a third digital signal.

15. The power conversion system of claim 14, in which the gate control signal is a first control signal, the threshold is a first threshold, and the state machine is to:

determine a drain-to-source voltage associated with the power transistor based on a difference between the second digital signal and the third digital signal;

determine that the power transistor does not have a fail-short condition when the difference satisfies a second threshold; and generate a second control signal to increase the gate voltage to the first voltage.

16. The power conversion system of claim 14, in which the threshold is a first threshold, and the state machine is to:

determine a drain-to-source voltage associated with the power transistor based on a difference between the second digital signal and the third digital signal;

detect a fail-short condition associated with the power transistor when the difference does not satisfy a second threshold and a BIST timer period has expired; and assert the alert signal when the fail-short condition is detected.

17. A gate-driver circuit, comprising:

a state machine having an enable input, having an alert output, having a gate voltage control output adapted to be coupled to a gate of a power transistor, and having a source voltage input adapted to be coupled to a source of the power transistor;

a variable voltage supply, the variable voltage supply coupled to the gate voltage control output, a first terminal of the variable voltage supply adapted to be coupled to a drain of the power transistor;

an amplifier, a first input of the amplifier coupled to a second terminal of the variable voltage supply, an output of the amplifier to be coupled to the gate of the power transistor, a second input of the amplifier to be coupled to the source of the power transistor; and a comparator, an output of the comparator coupled to the source voltage input, a first input of the comparator coupled to the output of the amplifier, the first input of the comparator to be coupled to the gate of the power transistor, a second input of the comparator to be coupled to the source of the power transistor.

18. The gate-driver circuit of claim 17, including a gate-drive supply, a first terminal of the gate-drive supply coupled to the first terminal of the variable voltage supply, the first terminal of the gate-drive supply to be coupled to the drain of the power transistor, and a second terminal of the gate-drive supply coupled to a third input of the amplifier.

19. The gate-driver circuit of claim 17, in which the output of the amplifier is coupled to a switch, the switch is adapted to be coupled to the gate of the power transistor.

20. The gate-driver circuit of claim 17, in which the second input of the amplifier is adapted to be coupled to a load, the load being at least one of one or more processors, non-volatile memory, or volatile memory associated with a vehicle.

* * * * *